United States Patent
Fisher et al.

(10) Patent No.: US 8,912,268 B2
(45) Date of Patent: *Dec. 16, 2014

(54) SILICONE RESIN FILM, METHOD OF PREPARING SAME, AND NANOMATERIAL-FILLED SILICONE COMPOSITION

(75) Inventors: Mark David Fisher, Midland, MI (US); Bizhong Zhu, Midland, MI (US)

(73) Assignee: Dow Corning Corporation, Midland, MI (US)

(*) Notice: Subject to any disclaimer, the term of this patent is extended or adjusted under 35 U.S.C. 154(b) by 1019 days.

This patent is subject to a terminal disclaimer.

(21) Appl. No.: 12/086,448

(22) PCT Filed: Nov. 22, 2006

(86) PCT No.: PCT/US2006/045158
§ 371 (c)(1),
(2), (4) Date: Sep. 11, 2009

(87) PCT Pub. No.: WO2008/045104
PCT Pub. Date: Apr. 17, 2008

(65) Prior Publication Data
US 2010/0068538 A1 Mar. 18, 2010

Related U.S. Application Data

(60) Provisional application No. 60/752,727, filed on Dec. 21, 2005.

(51) Int. Cl.
| | | |
|---|---|---|
| *C08K 3/04* | (2006.01) | |
| *B32B 9/04* | (2006.01) | |
| *C08J 5/00* | (2006.01) | |
| *B82Y 30/00* | (2011.01) | |
| *C08J 5/18* | (2006.01) | |
| *C08L 83/04* | (2006.01) | |
| *C09D 183/04* | (2006.01) | |
| *C08G 77/12* | (2006.01) | |
| *C08G 77/20* | (2006.01) | |

(52) U.S. Cl.
CPC ............... *C08J 5/005* (2013.01); *B82Y 30/00* (2013.01); *C08J 5/18* (2013.01); *C08L 83/04* (2013.01); *C09D 183/04* (2013.01); *C08G 77/12* (2013.01); *C08G 77/20* (2013.01); *C08J 2383/04* (2013.01); *C08K 3/04* (2013.01)
USPC .......................................... 524/495; 428/447

(58) Field of Classification Search
USPC ............ 264/492; 427/452, 44, 383, 337, 515; 428/447; 522/99, 148; 524/43, 424, 524/495, 496, 588, 847; 528/10, 12, 14, 15, 528/17, 31, 32, 33; 525/50, 474, 477, 478
See application file for complete search history.

(56) References Cited

U.S. PATENT DOCUMENTS

| | | |
|---|---|---|
| 736,971 A | 8/1903 | Jenkins |
| 2,702,764 A | 2/1955 | Painter et al. |
| 2,915,475 A | 12/1959 | Bugosh et al. |
| 3,031,417 A | 4/1962 | Bruce |
| 3,419,593 A | 12/1968 | Willing et al. |
| 3,445,420 A | 5/1969 | Kookootsedes et al. |
| 4,087,585 A | 5/1978 | Schulz |
| 4,260,780 A | 4/1981 | West |
| 4,273,697 A | 6/1981 | Sumimura et al. |
| 4,276,424 A | 6/1981 | Peterson, Jr. et al. |
| 4,314,956 A | 2/1982 | Baney et al. |
| 4,324,901 A | 4/1982 | West et al. |
| 4,332,525 A | 6/1982 | Cheney, Jr. |
| 4,395,443 A | 7/1983 | Shimizu et al. |
| 4,460,638 A | 7/1984 | Haluska |
| 4,460,639 A | 7/1984 | Chi et al. |
| 4,460,640 A | 7/1984 | Chi et al. |
| 4,500,447 A | 2/1985 | Kobayashi et al. |
| 4,510,094 A | 4/1985 | Drahnak |
| 4,530,879 A | 7/1985 | Drahnak |
| 4,537,829 A * | 8/1985 | Blizzard et al. ............... 428/429 |
| 4,568,566 A | 2/1986 | Tolentino |
| 4,572,814 A | 2/1986 | Naylor et al. |
| 4,618,666 A | 10/1986 | Port |
| 4,761,454 A | 8/1988 | Oba et al. |
| 4,766,176 A | 8/1988 | Lee et al. |
| 4,898,689 A | 2/1990 | Hamada |

(Continued)

FOREIGN PATENT DOCUMENTS

| | | |
|---|---|---|
| CN | 1528000 A | 9/2004 |
| CN | 1558931 A | 12/2004 |

(Continued)

OTHER PUBLICATIONS

Reese, Herschel, "Development of Silicone Substrates to be Used with CIGS Deposition," Final Report, Feb. 1, 2005, Contract F49620-03-C-0047.

(Continued)

*Primary Examiner* — Hui Chin

(74) *Attorney, Agent, or Firm* — Howard & Howard Attorneys PLLC

(57) ABSTRACT

A method of preparing a silicone resin film, the method comprising coating a release liner with a nanomaterial-filled silicone composition comprising a hydrosilylation-curable silicone composition and a carbon nanomaterial, and heating the coated release liner at a temperature sufficient to cure the silicone resin; a silicone resin film prepared according to the preceding method; and a nanomaterial-filled silicone composition.

17 Claims, No Drawings

(56) References Cited

U.S. PATENT DOCUMENTS

| | | | |
|---|---|---|---|
| 4,916,169 A | 4/1990 | Boardman et al. | |
| 4,952,658 A | 8/1990 | Kalchauer et al. | |
| 5,017,654 A | 5/1991 | Togashi et al. | |
| 5,135,980 A | 8/1992 | Watanabe | |
| 5,166,287 A | 11/1992 | Kalchauer et al. | |
| 5,194,649 A | 3/1993 | Okawa | |
| 5,213,868 A | 5/1993 | Liberty et al. | |
| 5,256,480 A | 10/1993 | Inoue et al. | |
| 5,278,272 A | 1/1994 | Lai et al. | |
| 5,281,455 A * | 1/1994 | Braun et al. | 428/40.7 |
| 5,283,309 A | 2/1994 | Morita | |
| 5,310,843 A | 5/1994 | Morita | |
| 5,312,946 A | 5/1994 | Stank et al. | |
| 5,319,051 A | 6/1994 | Tabei et al. | |
| 5,358,983 A | 10/1994 | Morita | |
| 5,371,139 A | 12/1994 | Yokoyama et al. | |
| 5,468,826 A | 11/1995 | Gentle et al. | |
| 5,468,827 A | 11/1995 | Morita | |
| 5,474,608 A | 12/1995 | Beisswanger | |
| 5,486,588 A | 1/1996 | Morita | |
| 5,496,961 A | 3/1996 | Dauth et al. | |
| 5,527,578 A | 6/1996 | Mazuret et al. | |
| 5,530,075 A | 6/1996 | Morita et al. | |
| 5,580,915 A | 12/1996 | Lin | |
| 5,581,008 A * | 12/1996 | Kobayashi | 556/434 |
| 5,585,147 A | 12/1996 | Ogawa et al. | |
| 5,738,976 A | 4/1998 | Okinoshima et al. | |
| 5,747,608 A | 5/1998 | Katsoulis et al. | |
| 5,794,649 A | 8/1998 | Spear et al. | |
| 5,801,262 A | 9/1998 | Adams | |
| 5,824,761 A | 10/1998 | Bujanowski et al. | |
| 5,830,950 A | 11/1998 | Katsoulis et al. | |
| 5,861,467 A | 1/1999 | Bujanowski et al. | |
| 5,904,796 A | 5/1999 | Freuler et al. | |
| 5,959,038 A | 9/1999 | Furukawa et al. | |
| 5,972,512 A | 10/1999 | Boisvert et al. | |
| 6,046,283 A | 4/2000 | Katsoulis et al. | |
| 6,194,063 B1 | 2/2001 | Oura et al. | |
| 6,204,301 B1 | 3/2001 | Oshima et al. | |
| 6,287,639 B1 | 9/2001 | Schmidt et al. | |
| 6,297,305 B1 * | 10/2001 | Nakata et al. | 524/313 |
| 6,310,146 B1 | 10/2001 | Katsoulis et al. | |
| 6,352,610 B1 | 3/2002 | Schmidt et al. | |
| 6,368,535 B1 | 4/2002 | Katsoulis et al. | |
| 6,376,078 B1 | 4/2002 | Inokuchi | |
| 6,378,599 B1 | 4/2002 | Schmidt et al. | |
| 6,387,487 B1 | 5/2002 | Greenberg et al. | |
| 6,407,922 B1 | 6/2002 | Eckblad et al. | |
| 6,432,497 B2 | 8/2002 | Bunyan | |
| 6,451,869 B1 | 9/2002 | Butts | |
| 6,617,674 B2 | 9/2003 | Becker et al. | |
| 6,644,395 B1 | 11/2003 | Bergin | |
| 6,652,958 B2 | 11/2003 | Tobita | |
| 6,656,425 B1 | 12/2003 | Benthien et al. | |
| 6,660,395 B2 | 12/2003 | McGarry et al. | |
| 6,689,859 B2 | 2/2004 | Li et al. | |
| 6,730,731 B2 | 5/2004 | Tobita et al. | |
| 6,783,692 B2 | 8/2004 | Bhagwagar | |
| 6,791,839 B2 | 9/2004 | Bhagwagar | |
| 6,831,145 B2 | 12/2004 | Kleyer et al. | |
| 6,838,005 B2 | 1/2005 | Tepper | |
| 6,841,213 B2 | 1/2005 | Parsonage et al. | |
| 6,884,314 B2 | 4/2005 | Cross et al. | |
| 6,902,688 B2 | 6/2005 | Narayan et al. | |
| 6,908,682 B2 | 6/2005 | Mistele | |
| 7,029,603 B2 | 4/2006 | Wang et al. | |
| 7,037,592 B2 | 5/2006 | Zhu et al. | |
| 7,074,481 B2 | 7/2006 | Watson | |
| 7,132,062 B1 | 11/2006 | Howard | |
| 7,147,367 B2 | 12/2006 | Balian et al. | |
| 7,163,720 B1 | 1/2007 | Dhaler et al. | |
| 7,253,442 B2 | 8/2007 | Huang et al. | |
| 7,311,967 B2 | 12/2007 | Dani et al. | |
| 7,339,012 B2 | 3/2008 | Prasse | |
| 7,381,470 B2 | 6/2008 | Suto et al. | |
| 7,459,192 B2 | 12/2008 | Parsonage et al. | |
| 7,563,515 B2 | 7/2009 | Ekeland et al. | |
| 7,622,159 B2 | 11/2009 | Mertz et al. | |
| 7,658,983 B2 | 2/2010 | Mormont et al. | |
| 7,799,842 B2 | 9/2010 | Anderson et al. | |
| 7,850,870 B2 | 12/2010 | Ahn et al. | |
| 2003/0047718 A1 * | 3/2003 | Narayan et al. | 252/500 |
| 2003/0054162 A1 | 3/2003 | Watson | |
| 2003/0077478 A1 | 4/2003 | Dani et al. | |
| 2003/0096104 A1 | 5/2003 | Tobita et al. | |
| 2003/0170418 A1 | 9/2003 | Mormont et al. | |
| 2003/0175533 A1 | 9/2003 | McGarry et al. | |
| 2003/0213939 A1 | 11/2003 | Narayan et al. | |
| 2004/0053059 A1 * | 3/2004 | Mistele | 428/447 |
| 2004/0089851 A1 | 5/2004 | Wang et al. | |
| 2004/0101679 A1 | 5/2004 | Mertz et al. | |
| 2004/0126526 A1 | 7/2004 | Parsonage et al. | |
| 2004/0166332 A1 | 8/2004 | Zhu et al. | |
| 2005/0059754 A1 | 3/2005 | Lunt et al. | |
| 2005/0113749 A1 | 5/2005 | Parsonage et al. | |
| 2005/0227091 A1 | 10/2005 | Suto et al. | |
| 2005/0281997 A1 | 12/2005 | Grah | |
| 2007/0020468 A1 | 1/2007 | Ekeland et al. | |
| 2007/0120100 A1 | 5/2007 | Glatkowski et al. | |
| 2007/0246245 A1 | 10/2007 | Ahn et al. | |
| 2008/0051548 A1 | 2/2008 | Bailey et al. | |
| 2008/0115827 A1 | 5/2008 | Woods et al. | |
| 2008/0138525 A1 | 6/2008 | Bailey et al. | |
| 2009/0005499 A1 | 1/2009 | Fisher et al. | |
| 2009/0090413 A1 | 4/2009 | Katsoulis et al. | |
| 2009/0105362 A1 | 4/2009 | Anderson et al. | |
| 2009/0155577 A1 | 6/2009 | Anderson et al. | |
| 2009/0246499 A1 | 10/2009 | Katsoulis et al. | |
| 2010/0028643 A1 | 2/2010 | Zhu | |
| 2010/0062247 A1 | 3/2010 | Fisher et al. | |
| 2010/0068538 A1 | 3/2010 | Fisher | |
| 2010/0075127 A1 | 3/2010 | Fisher et al. | |
| 2010/0086760 A1 | 4/2010 | Zhu | |
| 2010/0087581 A1 | 4/2010 | Fisher et al. | |
| 2010/0112321 A1 | 5/2010 | Zhu | |
| 2010/0129625 A1 | 5/2010 | Zhu | |
| 2010/0143686 A1 | 6/2010 | Zhu | |
| 2010/0209687 A1 | 8/2010 | Zhu | |
| 2010/0233379 A1 | 9/2010 | Fisher et al. | |
| 2010/0280172 A1 | 11/2010 | Zhu | |

FOREIGN PATENT DOCUMENTS

| | | |
|---|---|---|
| CN | 1676568 A | 10/2005 |
| DE | 19647368 | 5/1998 |
| DE | 19915378 A1 | 10/2000 |
| DE | 4033157 | 9/2003 |
| EP | 0126535 A1 | 11/1984 |
| EP | 0358452 A2 | 3/1990 |
| EP | 0480680 A1 | 4/1992 |
| EP | 0566311 A2 | 10/1993 |
| EP | 0562922 B1 | 5/1997 |
| EP | 0850998 A2 | 7/1998 |
| EP | 0936250 A2 | 8/1999 |
| EP | 1050538 A2 | 11/2000 |
| EP | 1065248 A2 | 1/2001 |
| EP | 1454962 A1 | 9/2004 |
| EP | 1391492 B1 | 6/2006 |
| FR | 2564470 A1 | 11/1985 |
| GB | 736971 | 9/1955 |
| JP | 47-27300 A | 10/1972 |
| JP | 53-118470 A | 10/1978 |
| JP | 59-025742 A | 2/1984 |
| JP | 59-096122 | 6/1984 |
| JP | 59-199547 A | 11/1984 |
| JP | 62-003947 | 1/1987 |
| JP | 02-058587 A | 2/1990 |
| JP | 08-027381 A | 1/1996 |
| JP | 08-037418 A | 2/1996 |
| JP | 09-064391 A | 3/1997 |
| JP | 10-001549 | 1/1998 |
| JP | 10-212410 A | 8/1998 |
| JP | 2000-119526 A | 4/2000 |
| JP | 2000-195337 A | 7/2000 |

(56) References Cited

FOREIGN PATENT DOCUMENTS

| | | | | |
|---|---|---|---|---|
| JP | 2001-291431 | A | 10/2001 | |
| JP | 2004-002653 | A | 1/2004 | |
| JP | 2004-339427 | A | 12/2004 | |
| JP | 2005-520020 | A | 7/2005 | |
| JP | 2007-090817 | A | 4/2007 | |
| JP | 2008-530339 | A | 8/2008 | |
| TW | 2004/18964 | A | 10/2004 | |
| WO | 94/17003 | A1 | 8/1994 | |
| WO | 02/082468 | A1 | 10/2002 | |
| WO | 02/085612 | A2 | 10/2002 | |
| WO | 03/078079 | A1 | 9/2003 | |
| WO | 03/099828 | A1 | 12/2003 | |
| WO | 03104329 | A1 | 12/2003 | |
| WO | WO 2004035661 | A1 * | 4/2004 | ............ C08G 77/20 |
| WO | 2004/060472 | A1 | 7/2004 | |
| WO | 2004076175 | A1 | 9/2004 | |
| WO | 2004/106420 | A2 | 12/2004 | |
| WO | 2005/114324 | A2 | 12/2005 | |
| WO | 2006/088645 | A1 | 8/2006 | |
| WO | 2006/088646 | A1 | 8/2006 | |
| WO | 2007/013135 | A1 | 2/2007 | |
| WO | 2007/018756 | A1 | 2/2007 | |
| WO | 2007/092118 | A2 | 8/2007 | |
| WO | WO 2007/097835 | A2 | 8/2007 | |
| WO | 2007/121006 | A2 | 10/2007 | |
| WO | 2007/123901 | A1 | 11/2007 | |
| WO | 2008/013611 | A1 | 1/2008 | |
| WO | 2008/013612 | A1 | 1/2008 | |
| WO | 2008/045104 | A2 | 4/2008 | |
| WO | 2008/051242 | A2 | 5/2008 | |
| WO | 2009/007786 | A2 | 1/2009 | |

OTHER PUBLICATIONS

Partial English Translation for JP62-003947, dated Nov. 15, 2011, 2 pages.
English language abstract of JP 02-058587 extracted from espacenet.com database dated Nov. 15, 2011; 1 page
English language abstract of JP 2000-119526 extracted from espacenet.com database dated Nov. 15, 2011; 1 page.
English language abstract of JP 53-118470 extracted from espacenet.com database dated Nov. 15, 2011; 1 page.
English language abstract of JP 2000-195337 extracted from espacenet.com database dated Nov. 14, 2011; 1 page.
English Language abstract of JP 2004-002653 extracted from espacenet.com database dated Nov. 14, 2011; 1 page.
English Language abstract of JP 2001-291431 extracted from espacenet.com database dated Nov. 14, 2011; 1 page.
English Language abstract of JP 9-64391 extracted from espacenet.com database dated Nov. 14, 2011; 1 page.
English Language abstract of JP 8-37418 extracted from espacenet.com database dated Nov. 14, 2011; 1 page.
English Language abstract of JP 8-27381 extracted from espacenet.com database dated Nov. 14, 2011; 1 page.
English language abstract of JP 59-096122 extracted from espacenet.com database dated Aug. 26, 2011; 1 page.
English language abstract of FR 2564470 extracted from espacenet.com database dated Oct. 12, 2010; 2 pages.
English language abstract of JP 10-001549 extracted from espacenet.com database dated Aug. 26, 2011; 1 page.
English language abstract of DE 19647368 extracted from espacenet.com database dated Aug. 26, 2011; 1 page.
English language abstract of DE 19915378 extracted from espacenet.com database dated Aug. 26, 2011; 1 page.
English language abstract of DE 4033157 extracted from espacenet.com database dated Aug. 26, 2011; 1 page.
English language abstract of CN 1528000 extracted from espacenet.com database dated Sep. 23, 2010; 1 page.
English language abstract of TW 2004/18964 dated Sep. 23, 2010; 3 pages.
English language translation and abstract for JP 2004-339427 extracted from PAJ database, dated Oct. 15, 2010, 51 pages.
English language abstract of CN1558931 extracted from espacenet.com database dated Aug. 26, 2011; 1 page.
English language abstract of CN 1676568 extracted from espacenet.com database dated Mar. 1, 2011; 1 page.
English language abstract of JP 2007-090817 extracted from espacenet.com database dated Aug. 26, 2011; 1 page.
Guo, Andrew, et al., "Highly Active Visible-Light Photocatalysts for Curing a Ceramic Precursor," Chemical Materials, 1998, pp. 531-536, vol. 10, American Chemical Society.
Zhu, H.Y., "Novel synthesis of aluminum oxide nanofibers," Materials Research Society Symposium Proceedings, vol. 703, held Nov. 26-29, 2001, Nanophase and Nanocomposite Materials IV. Symposium, published 2002, pp. 25-30, Materials Research Society, Warrendale, Pennsylvania, USA.
Frogley, Mark D. et al., "Mechanical Properties of Carbon Nanoparticle-reinforced Elastomers", Composites Science and Techology, 2003, pp. 1647-1654, vol. 63.

* cited by examiner

SILICONE RESIN FILM, METHOD OF PREPARING SAME, AND NANOMATERIAL-FILLED SILICONE COMPOSITION

CROSS-REFERENCE TO RELATED APPLICATIONS

This application is a U.S national stage filing under 35 U.S.C. §371 of PCT Application No. PCT/US06/045158 filed on 22Nov. 2006, currently pending, which claims the benefit of U.S. Provisional Patent Application No. 60/752727 filed 21 Dec. 2005 under 35 U.S.C. §119 (e). PCT Application No. PCT/US06/045158 and U.S. Provisional Patent Application No. 60/752727 are hereby incorporated by reference.

FIELD OF THE INVENTION

The present invention relates to a method of preparing a silicone resin film and more particularly to a method comprising coating a release liner with a nanomaterial-filled silicone composition comprising a hydrosilylation-curable silicone composition and a carbon nanomaterial, and heating the coated release liner at a temperature sufficient to cure the silicone resin. The present invention also relates to a silicone resin film prepared according to the preceding method, and to a nanomaterial-filled silicone composition.

BACKGROUND OF THE INVENTION

Silicone resins are useful in a variety of applications by virtue of their unique combination of properties, including high thermal stability, good moisture resistance, excellent flexibility, high oxygen resistance, low dielectric constant, and high transparency. For example, silicone resins are widely used as protective or dielectric coatings in the automotive, electronic, construction, appliance, and aerospace industries.

Although silicone resin coatings can be used to protect, insulate, or bond a variety of substrates, free standing silicone resin films have limited utility due to low tear strength, high brittleness, low glass transition temperature, and high coefficient of thermal expansion. Consequently, there is a need for free standing silicone resin films having improved mechanical and thermal properties.

SUMMARY OF THE INVENTION

The present invention is directed to a method of preparing a silicone resin film, the method comprising the steps of:
  coating a release liner with a nanomaterial-filled silicone composition, wherein the silicone composition comprises:
    a hydrosilylation-curable silicone composition comprising a silicone resin having an average of at least two silicon-bonded alkenyl groups or silicon-bonded hydrogen atoms per molecule, and
    a carbon nanomaterial; and
  heating the coated release liner at a temperature sufficient to cure the silicone resin.

The present invention is also directed to a silicone resin film prepared according to the aforementioned method.

The present method is further directed to a nanomaterial-filled silicone composition, comprising:
  a hydrosilylation-curable silicone composition comprising a silicone resin having an average of at least two silicon-bonded alkenyl groups or silicon-bonded hydrogen atoms per molecule; and
  a carbon nanomaterial.

The silicone resin film of the present invention has low coefficient of thermal expansion, high tensile strength, and high modulus compared to a silicone resin film prepared from the same silicone composition absent the carbon nanomaterial. Also, although the filled (i.e., carbon nanomaterial-containing) and unfilled silicone resin films have comparable glass transition temperatures, the former film exhibits a smaller change in modulus in the temperature range corresponding to the glass transition.

The silicone resin film of the present invention is useful in applications requiring films having high thermal stability, flexibility, mechanical strength, and transparency. For example, the silicone resin film can be used as an integral component of flexible displays, solar cells, flexible electronic boards, touch screens, fire-resistant wallpaper, and impact-resistant windows. The film is also a suitable substrate for transparent or nontransparent electrodes.

DETAILED DESCRIPTION OF THE INVENTION

As used herein, the term "free of aliphatic unsaturation" means the hydrocarbyl or halogen-substituted hydrocarbyl group does not contain an aliphatic carbon-carbon double bond or carbon-carbon triple bond. Also, the term "mol % of the groups $R^2$ in the silicone resin are alkenyl" is defined as the ratio of the number of moles of silicon-bonded alkenyl groups in the silicone resin to the total number of moles of the groups $R^2$ in the resin, multiplied by 100. Further, the term "mol % of the groups $R^4$ in the organohydrogenpolysiloxane resin are organosilylalkyl" is defined as the ratio of the number of moles of silicon-bonded organosilylalkyl groups in the organohydrogenpolysiloxane resin to the total number of moles of the groups $R^4$ in the resin, multiplied by 100. Still further, the term "mol % of the groups $R^5$ in the silicone resin are hydrogen" is defined as the ratio of the number of moles of silicon-bonded hydrogen atoms in the silicone resin to the total number of moles of the groups $R^5$ in the resin, multiplied by 100.

A nanomaterial-filled silicone composition according to the present invention, comprises:
  a hydrosilylation-curable silicone composition comprising a silicone resin having an average of at least two silicon-bonded alkenyl groups or silicon-bonded hydrogen atoms per molecule; and
  a carbon nanomaterial.

The hydrosilylation-curable silicone composition can be any hydrosilylation-curable silicone composition containing a silicone resin having an average of at least two silicon-bonded alkenyl groups or silicon-bonded hydrogen atoms per molecule. Typically, the hydrosilylation-curable silicone composition comprises the aforementioned silicone resin; an organosilicon compound in an amount sufficient to cure the silicone resin, wherein the organosilicon compound has an average of at least two silicon-bonded hydrogen atoms or silicon-bonded alkenyl groups per molecule capable of reacting with the silicon-bonded alkenyl groups or silicon-bonded hydrogen atoms in the silicone resin; and a catalytic amount of a hydrosilylation catalyst.

The silicone resin of the hydrosilylation-curable silicone composition is typically a copolymer containing T and/or Q siloxane units in combination with M and/or D siloxane units. Moreover, the silicone resin can be a rubber-modified silicone resin, described below for the fifth and sixth embodiments of the hydrosilylation-curable silicone composition.

According to a first embodiment, the hydrosilylation-curable silicone composition comprises (A) a silicone resin having the formula $(R^1R^2{}_2SiO_{1/2})_w(R^2{}_2SiO_{2/2})_x(R^1SiO_{3/2})_y(SiO_{4/2})_z$ (I), wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded alkenyl groups per molecule; (B) an organosilicon compound having an average of at least two silicon-bonded hydrogen atoms per molecule in an amount sufficient to cure the silicone resin; and (C) a catalytic amount of a hydrosilylation catalyst.

Component (A) is at least one silicone resin having the formula $(R^1R^2{}_2SiO_{1/2})_w(R^2{}_2SiO_{2/2})_x(R^1SiO_{3/2})_y(SiO_{4/2})_z$ (I), wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded alkenyl groups per molecule.

The hydrocarbyl and halogen-substituted hydrocarbyl groups represented by $R^1$ are free of aliphatic unsaturation and typically have from 1 to 10 carbon atoms, alternatively from 1 to 6 carbon atoms. Acyclic hydrocarbyl and halogen-substituted hydrocarbyl groups containing at least 3 carbon atoms can have a branched or unbranched structure. Examples of hydrocarbyl groups represented by $R^1$ include, but are not limited to, alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl; cycloalkyl, such as cyclopentyl, cyclohexyl, and methylcyclohexyl; aryl, such as phenyl and naphthyl; alkaryl, such as tolyl and xylyl; and aralkyl, such as benzyl and phenethyl. Examples of halogen-substituted hydrocarbyl groups represented by $R^1$ include, but are not limited to, 3,3,3-trifluoropropyl, 3-chloropropyl, chlorophenyl, dichlorophenyl, 2,2,2-trifluoroethyl, 2,2,3,3-tetrafluoropropyl, and 2,2,3,3,4,4,5,5-octafluoropentyl.

The alkenyl groups represented by $R^2$, which may be the same or different, typically have from 2 to about 10 carbon atoms, alternatively from 2 to 6 carbon atoms, and are exemplified by, but not limited to, vinyl, allyl, butenyl, hexenyl, and octenyl.

In the formula (I) of the silicone resin, the subscripts w, x, y, and z are mole fractions. The subscript w typically has a value of from 0 to 0.8, alternatively from 0.02 to 0.75, alternatively from 0.05 to 0.3; the subscript x typically has a value of from 0 to 0.6, alternatively from 0 to 0.45, alternatively from 0 to 0.25; the subscript y typically has a value of from 0 to 0.99, alternatively from 0.25 to 0.8, alternatively from 0.5 to 0.8; the subscript z typically has a value of from 0 to 0.35, alternatively from 0 to 0.25, alternatively from 0 to 0.15. Also, the ratio y+z/(w+x+y+z) is typically from 0.2 to 0.99, alternatively from 0.5 to 0.95, alternatively from 0.65 to 0.9. Further, the ratio w+x/(w+x+y+z) is typically from 0.01 to 0.80, alternatively from 0.05 to 0.5, alternatively from 0.1 to 0.35.

Typically at least 50 mol %, alternatively at least 65 mol %, alternatively at least 80 mol % of the groups $R^2$ in the silicone resin are alkenyl.

The silicone resin typically has a number-average molecular weight ($M_n$) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The viscosity of the silicone resin at 25° C. is typically from 0.01 to 100,000 Pa·s, alternatively from 0.1 to 10,000 Pa·s, alternatively from 1 to 100 Pa·s.

The silicone resin typically contains less than 10% (w/w), alternatively less than 5% (w/w), alternatively less than 2% (w/w), of silicon-bonded hydroxy groups, as determined by $^{29}$Si NMR.

The silicone resin contains $R^1SiO_{3/2}$ units (i.e., T units) and/or $SiO_{4/2}$ units (i.e., Q units) in combination with $R^1R^2{}_2SiO_{1/2}$ units (i.e., M units) and/or $R^2{}_2SiO_{2/2}$ units (i.e., D units), where $R^1$ and $R^2$ are as described and exemplified above. For example, the silicone resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of silicone resins include, but are not limited to, resins having the following formulae: $(Vi_2MeSiO_{1/2})_{0.25}(PhSiO_{3/2})_{0.75}$, $(ViMe_2SiO_{1/2})_{0.25}(PhSiO_{3/2})_{0.75}$, $(ViMe_2SiO_{1/2})_{0.25}(MeSiO_{3/2})_{0.25}(PhSiO_{3/2})_{0.50}$, $(ViMe_2SiO_{1/2})_{0.15}(PhSiO_{3/2})_{0.75}(SiO_{4/2})_{0.1}$, and $(Vi_2MeSiO_{1/2})_{0.15}(ViMe_2SiO_{1/2})_{0.1}(PhSiO_{3/2})_{0.75}$, where Me is methyl, Vi is vinyl, Ph is phenyl, and the numerical subscripts outside the parenthesis denote mole fractions. Also, in the preceding formulae, the sequence of units is unspecified.

Component (A) can be a single silicone resin or a mixture comprising two or more different silicone resins, each as described above.

Methods of preparing silicone resins are well known in the art; many of these resins are commercially available: Silicone resins are typically prepared by cohydrolyzing the appropriate mixture of chlorosilane precursors in an organic solvent, such as toluene. For example, a silicone resin consisting essentially of $R^1R^2{}_2SiO_{1/2}$ units and $R^1SiO_{3/2}$ units can be prepared by cohydrolyzing a compound having the formula $R^1R^2{}_2SiCl$ and a compound having the formula $R^1SiCl_3$ in toluene, where $R^1$ and $R^2$ are as defined and exemplified above. The aqueous hydrochloric acid and silicone hydrolyzate are separated and the hydrolyzate is washed with water to remove residual acid and heated in the presence of a mild condensation catalyst to "body" the resin to the requisite viscosity. If desired, the resin can be further treated with a condensation catalyst in an organic solvent to reduce the content of silicon-bonded hydroxy groups. Alternatively, silanes containing hydrolysable groups other than chloro, such —Br, —I, —OCH$_3$, —OC(O)CH$_3$, —N(CH$_3$)$_2$, NHCOCH$_3$, and —SCH$_3$, can be utilized as starting materials in the cohydrolysis reaction. The properties of the resin products depend on the types of silanes, the mole ratio of silanes, the degree of condensation, and the processing conditions.

Component (B) is at least one organosilicon compound having an average of at least two silicon-bonded hydrogen atoms per molecule in an amount sufficient to cure the silicone resin of component (A).

The organosilicon compound has an average of at least two silicon-bonded hydrogen atoms per molecule, alternatively at least three silicon-bonded hydrogen atoms per molecule. It is generally understood that cross-linking occurs when the sum of the average number of alkenyl groups per molecule in component (A) and the average number of silicon-bonded hydrogen atoms per molecule in component (B) is greater than four.

The organosilicon compound can be an organohydrogensilane or an organohydrogensiloxane. The organohydrogensilane can be a monosilane, disilane, trisilane, or polysilane.

Similarly, the organohydrogensiloxane can be a disiloxane, trisiloxane, or polysiloxane. The structure of the organosilicon compound can be linear, branched, cyclic, or resinous. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded hydrogen atoms can be located at terminal, pendant, or at both terminal and pendant positions.

Examples of organohydrogensilanes include, but are not limited to, diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene, and poly(methylsilylene)methylene.

The organohydrogensilane can also have the formula $HR^1_2Si—R^3—SiR^1_2H$, wherein $R^1$ is $C_1$ to $C_{10}$ hydrocarbyl or $C_1$ to $C_{10}$ halogen-substituted hydrocarbyl, both free of aliphatic unsaturation, and $R^3$ is a hydrocarbylene group free of aliphatic unsaturation having a formula selected from:

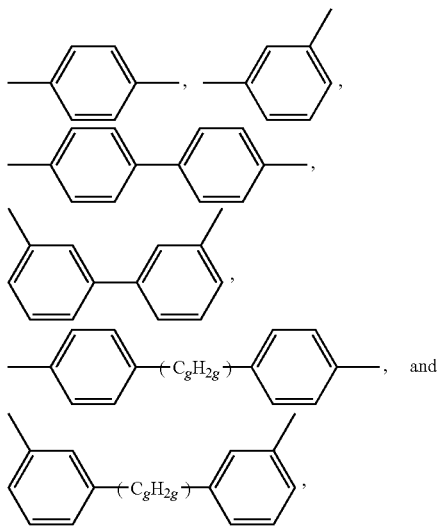

wherein g is from 1 to 6. The hydrocarbyl and halogen-substituted hydrocarbyl groups represented by $R^1$ are as defined and exemplified above for the silicone resin of component (A).

Examples of organohydrogensilanes having the formula $HR^1_2Si—R^3—SiR^1_2H$, wherein $R^1$ and $R^3$ are as described and exemplified above include, but are not limited to, silanes having the following formulae:

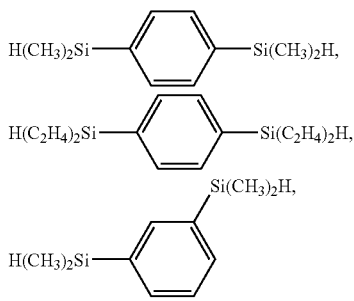

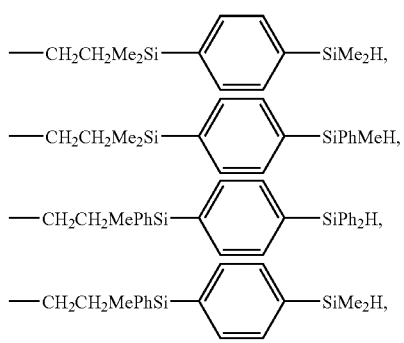

Examples of organohydrogensiloxanes include, but are not limited to, 1,1,3,3-tetramethyldisiloxane, 1,1,3,3-tetraphenyldisiloxane, phenyltris(dimethylsiloxy)silane, 1,3,5-trimethylcyclotrisiloxane, a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $HMe_2SiO_{1/2}$ units, $Me_3SiO_{1/2}$ units, and $SiO_{4/2}$ units, wherein Me is methyl.

The organohydrogensiloxane can also be an organohydrogenpolysiloxane resin having the formula $(R^1R^4_2SiO_{1/2})_w$ $(R^4_2SiO_{2/2})_x(R^1SiO_{3/2})_y(SiO_{4/2})_z$ (II), wherein $R^1$ is $C_1$ to $C_{10}$ hydrocarbyl or $C_1$ to $C_{10}$ halogen-substituted hydrocarbyl, both free of aliphatic unsaturation, $R^4$ is $R^1$ or an organosilylalkyl group having at least one silicon-bonded hydrogen atom, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided at least 50 mol % of the groups $R^4$ are organosilylalkyl.

The hydrocarbyl and halogen-substituted hydrocarbyl groups represented by $R^1$ are as described and exemplified above for the silicone resin of component (A). Examples of organosilylalkyl groups represented by $R^4$ include, but are not limited to, groups having the following formulae:

—$CH_2CH_2SiMe_2H$,   —$CH_2CH_2SiMe_2C_nH_{2n}SiMe_2H$,
—$CH_2CH_2SiMe_2C_nH_{2n}SiMePhH$,   —$CH_2CH_2SiMePhH$,
—$CH_2CH_2SiPh_2H$,   —$CH_2CH_2SiMePhC_nH_{2n}SiPh_2H$,
—$CH_2CH_2SiMePhC_nH_{2n}SiMe_2H$,
—$CH_2CH_2SiMePhOSiMePhH$, and
—$CH_2CH_2SiMePhOSiPh(OSiMePhH)_2$, where Me is methyl, Ph is phenyl, and the subscript n has a value of from 2 to 10.

In the formula (II) of the organohydrogenpolysiloxane resin, the subscripts w, x, y, and z are mole fractions. The subscript w typically has a value of from 0 to 0.8, alternatively from 0.02 to 0.75, alternatively from 0.05 to 0.3; the subscript x typically has a value of from 0 to 0.6, alternatively from 0 to 0.45, alternatively from 0 to 0.25; the subscript y typically has a value of from 0 to 0.99, alternatively from 0.25 to 0.8, alternatively from 0.5 to 0.8; the subscript z typically has a value of from 0 to 0.35, alternatively from 0 to 0.25, alternatively from 0 to 0.15. Also, the ratio y+z/(w+x+y+z) is typically from 0.2 to 0.99, alternatively from 0.5 to 0.95, alternatively from 0.65 to 0.9. Further, the ratio w+x/(w+x+y+z) is typically from 0.01 to 0.80, alternatively from 0.05 to 0.5, alternatively from 0.1 to 0.35.

Typically, at least 50 mol %, alternatively at least 65 mol %, alternatively at least 80 mol % of the groups $R^4$ in the organohydrogenpolysiloxane resin are organosilylalkyl groups having at least one silicon-bonded hydrogen atom.

The organohydrogenpolysiloxane resin typically has a number-average molecular weight ($M_n$) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The organohydrogenpolysiloxane resin typically contains less than 10% (w/w), alternatively less than 5% (w/w), alternatively less than 2% (w/w), of silicon-bonded hydroxy groups, as determined by $^{29}$Si NMR.

The organohydrogenpolysiloxane resin contains $R^1SiO_{3/2}$ units (i.e., T units) and/or $SiO_{4/2}$ units (i.e., Q units) in combination with $R^1R^4_2SiO_{1/2}$ units (i.e., M units) and/or $R^4_2SiO_{2/2}$ units (i.e., D units), where $R^1$ and $R^4$ are as described and exemplified above. For example, the organohydrogenpolysiloxane resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of organohydrogenpolysiloxane resins include, but are not limited to, resins having the following formulae: $((HMe_2SiC_6H_4SiMe_2CH_2CH_2)_2MeSiO_{1/2})_{0.12}(PhSiO_{3/2})_{0.88}$, $((HMe_2SiC_6H_4SiMe_2CH_2CH_2)_2MeSiO_{1/2})_{0.17}(PhSiO_{3/2})_{0.83}$, $((HMe_2SiC_6H_4SiMe_2CH_2CH_2)_2MeSiO_{1/2})_{0.17}(MeSiO_{3/2})_{0.17}(PhSiO_{3/2})_{0.66}$, $((HMe_2SiC_6H_4SiMe_2CH_2CH_2)_2MeSiO_{1/2})_{0.15}(PhSiO_{3/2})_{0.75}(SiO_{4/2})_{0.10}$, and $((HMe_2SiC_6H_4SiMe_2CH_2CH_2)_2MeSiO_{1/2})_{0.08}((HMe_2SiC_6H_4SiMe_2CH_2CH_2)Me_2SiO_{1/2})_{0.06}(PhSiO_{3/2})_{0.86}$, where Me is methyl, Ph is phenyl, $C_6H_4$ denotes a para-phenylene group, and the numerical subscripts outside the parenthesis denote mole fractions. Also, in the preceding formulae, the sequence of units is unspecified.

Component (B) can be a single organosilicon compound or a mixture comprising two or more different organosilicon compounds, each as described above. For example, component (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane. In particular, component (B) can be a mixture comprising at least 0.5% (w/w), alternatively at least 50% (w/w), alternatively at least 75% (w/w), based on the total weight of component (B), of the organohydrogenpolysiloxane resin having the formula (II), and an organohydrogensilane and/or organohydrogensiloxane, the latter different from the organohydrogenpolysiloxane resin.

The concentration of component (B) is sufficient to cure (cross-link) the silicone resin of component (A). The exact amount of component (B) depends on the desired extent of cure, which generally increases as the ratio of the number of moles of silicon-bonded hydrogen atoms in component (B) to the number of moles of alkenyl groups in component (A) increases. The concentration of component (B) is typically sufficient to provide from 0.4 to 2 moles of silicon-bonded hydrogen atoms, alternatively from 0.8 to 1.5 moles of silicon-bonded hydrogen atoms, alternatively from 0.9 to 1.1 moles of silicon-bonded hydrogen atoms, per mole of alkenyl groups in component (A).

Methods of preparing organosilicon compounds containing silicon-bonded hydrogen atoms are well known in the art. For example, organohydrogensilanes can be prepared by reaction of Grignard reagents with alkyl or aryl halides. In particular, organohydrogensilanes having the formula $HR^1_2Si—R^3—SiR^1_2H$ can be prepared by treating an aryl dihalide having the formula $R^3X_2$ with magnesium in ether to produce the corresponding Grignard reagent and then treating the Grignard reagent with a chlorosilane having the formula $HR^1_2SiCl$, where $R^1$ and $R^3$ are as described and exemplified above.

Methods of preparing organohydrogensiloxanes, such as the hydrolysis and condensation of organohalosilanes, are also well known in the art.

In addition, the organohydrogenpolysiloxane resin having the formula (II) can be prepared by reacting (a) a silicone resin having the formula $(R^1R^2_2SiO_{1/2})_w(R^2_2SiO_{2/2})_x(R^1SiO_{3/2})_y(SiO_{4/2})_z$ (I) with (b) an organosilicon compound having an average of from two to four silicon-bonded hydrogen atoms per molecule and a molecular weight less than 1,000, in the presence of (c) a hydrosilylation catalyst and, optionally, (d) an organic solvent, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (a) has an average of at least two silicon-bonded alkenyl groups per molecule, and the mole ratio of silicon-bonded hydrogen atoms in (b) to alkenyl groups in (a) is from 1.5 to 5.

Silicone resin (a) is as described and exemplified above for component (A) of the silicone composition. Silicone resin (a) can be the same as or different than the silicone resin used as component (A) in the hydrosilylation-curable silicone composition.

Organosilicon compound (b) is at least one organosilicon compound having an average of from two to four silicon-bonded hydrogen atoms per molecule. Alternatively, the organosilicon compound has an average of from two to three silicon-bonded hydrogen atoms per molecule. The organosilicon compound typically has a molecular weight less than 1,000, alternatively less than 750, alternatively less than 500. The silicon-bonded organic groups in the organosilicon compound are selected from hydrocarbyl and halogen-substituted hydrocarbyl groups, both free of aliphatic unsaturation, which are as described and exemplified above for $R^1$ in the formula of the silicone resin of component (A).

Organosilicon compound (b) can be an organohydrogensilane or an organohydrogensiloxane. The organohydrogensilane can be a monosilane, disilane, trisilane, or polysilane. Similarly, the organohydrogensiloxane can be a disiloxane, trisiloxane, or polysiloxane. The structure of the organosilicon compound can be linear, branched, or cyclic. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded hydrogen atoms can be located at terminal, pendant, or at both terminal and pendant positions.

Examples of organohydrogensilanes include, but are not limited to, diphenylsilane, 2-chloroethylsilane, bis[(p-dimethylsilyl)phenyl]ether, 1,4-dimethyldisilylethane, 1,3,5-tris(dimethylsilyl)benzene, and 1,3,5-trimethyl-1,3,5-trisilane. The organohydrogensilane can also have the formula $HR^1{}_2Si-R^3-SiR^1{}_2H$, wherein $R^1$ and $R^3$ are as described and exemplified above.

Examples of organohydrogensiloxanes include, but are not limited to, 1,1,3,3-tetramethyldisiloxane, 1,1,3,3-tetraphenyldisiloxane, phenyltris(dimethylsiloxy)silane, and 1,3,5-trimethylcyclotrisiloxane.

Organosilicon compound (b) can be a single organosilicon compound or a mixture comprising two or more different organosilicon compounds, each as described above. For example, component (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane.

Methods of preparing organohydrogensilanes, such as the reaction of Grignard reagents with alkyl or aryl halides, described above, are well known in the art. Similarly, methods of preparing organohydrogensiloxanes, such as the hydrolysis and condensation of organohalosilanes, are well known in the art.

Hydrosilylation catalyst (c) can be any of the well-known hydrosilylation catalysts comprising a platinum group metal (i.e., platinum, rhodium, ruthenium, palladium, osmium and iridium) or a compound containing a platinum group metal. Preferably, the platinum group metal is platinum, based on its high activity in hydrosilylation reactions.

Hydrosilylation catalysts include the complexes of chloroplatinic acid and certain vinyl-containing organosiloxanes disclosed by Willing in U.S. Pat. No. 3,419,593, which is hereby incorporated by reference. A catalyst of this type is the reaction product of chloroplatinic acid and 1,3-diethenyl-1,1,3,3-tetramethyldisiloxane.

The hydrosilylation catalyst can also be a supported hydrosilylation catalyst comprising a solid support having a platinum group metal on the surface thereof. A supported catalyst can be conveniently separated from the organohydrogenpolysiloxane resin product, for example, by filtering the reaction mixture. Examples of supported catalysts include, but are not limited to, platinum on carbon, palladium on carbon, ruthenium on carbon, rhodium on carbon, platinum on silica, palladium on silica, platinum on alumina, palladium on alumina, and ruthenium on alumina.

Organic solvent (d) is at least one organic solvent. The organic solvent can be any aprotic or dipolar aprotic organic solvent that does not react with silicone resin (a), organosilicon compound (b), or the organohydrogenpolysiloxane resin under the conditions of the present method, and is miscible with components (a), (b), and the organohydrogenpolysiloxane resin.

Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. Organic solvent (d) can be a single organic solvent or a mixture comprising two or more different organic solvents, each as described above.

The reaction can be carried out in any standard reactor suitable for hydrosilylation reactions. Suitable reactors include glass and Teflon-lined glass reactors. Preferably, the reactor is equipped with a means of agitation, such as stirring. Also, preferably, the reaction is carried out in an inert atmosphere, such as nitrogen or argon, in the absence of moisture.

The silicone resin, organosilicon compound, hydrosilylation catalyst, and, optionally, organic solvent, can be combined in any order. Typically, organosilicon compound (b) and hydrosilylation catalyst (c) are combined before the introduction of the silicone resin (a) and, optionally, organic solvent (d).

The reaction is typically carried out at a temperature of from 0 to 150° C., alternatively from room temperature (~23±2° C.) to 115° C. When the temperature is less than 0° C., the rate of reaction is typically very slow.

The reaction time depends on several factors, such as the structures of the silicone resin and the organosilicon compound, and the temperature. The time of reaction is typically from 1 to 24 h at a temperature of from room temperature (~23±2° C.) to 150° C. The optimum reaction time can be determined by routine experimentation using the methods set forth in the Examples section below.

The mole ratio of silicon-bonded hydrogen atoms in organosilicon compound (b) to alkenyl groups in silicone resin (a) is typically from 1.5 to 5, alternatively from 1.75 to 3, alternatively from 2 to 2.5.

The concentration of hydrosilylation catalyst (c) is sufficient to catalyze the addition reaction of silicone resin (a) with organosilicon compound (b). Typically, the concentration of hydrosilylation catalyst (c) is sufficient to provide from 0.1 to 1000 ppm of a platinum group metal, alternatively from 1 to 500 ppm of a platinum group metal, alternatively from 5 to 150 ppm of a platinum group metal, based on the combined weight of silicone resin (a) and organosilicon compound (b). The rate of reaction is very slow below 0.1 ppm of platinum group metal. The use of more than 1000 ppm of platinum group metal results in no appreciable increase in reaction rate, and is therefore uneconomical.

The concentration of organic solvent (d) is typically from 0 to 99% (w/w), alternatively from 30 to 80% (w/w), alternatively from 45 to 60% (w/w), based on the total weight of the reaction mixture.

The organohydrogenpolysiloxane resin can be used without isolation or purification in the first embodiment of the hydrosilylation-curable silicone composition or the resin can be separated from most of the solvent by conventional methods of evaporation. For example, the reaction mixture can be heated under reduced pressure. Moreover, when the hydrosilylation catalyst used to prepare the organohydrogenpolysiloxane resin is a supported catalyst, described above, the resin can be readily separated from the hydrosilylation catalyst by filtering the reaction mixture. However, when the organohydrogenpolysiloxane resin is not separated from the hydrosilylation catalyst used to prepare the resin, the catalyst may be used as component (C) of the first embodiment of the hydrosilylation-curable silicone composition.

Component (C) of the hydrosilylation-curable silicone composition is at least one hydrosilylation catalyst that promotes the addition reaction of component (A) with component (B). The hydrosilylation catalyst can be any of the well-known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

Preferred hydrosilylation catalysts include the complexes of chloroplatinic acid and certain vinyl-containing organosiloxanes disclosed by Willing in U.S. Pat. No. 3,419,593, which is hereby incorporated by reference. A preferred catalyst of this type is the reaction product of chloroplatinic acid and 1,3-diethenyl-1,1,3,3-tetramethyldisiloxane.

The hydrosilylation catalyst can also be a microencapsulated platinum group metal-containing catalyst comprising a platinum group metal encapsulated in a thermoplastic resin. Compositions containing microencapsulated hydrosilylation catalysts are stable for extended periods of time, typically several months or longer, under ambient conditions, yet cure relatively rapidly at temperatures above the melting or softening point of the thermoplastic resin(s). Microencapsulated hydrosilylation catalysts and methods of preparing them are well known in the art, as exemplified in U.S. Pat. No. 4,766,176 and the references cited therein; and U.S. Pat. No. 5,017,654.

Component (C) can be a single hydrosilylation catalyst or a mixture comprising two or more different catalysts that differ in at least one property, such as structure, form, platinum group metal, complexing ligand, and thermoplastic resin.

The concentration of component (C) is sufficient to catalyze the addition reaction of component (A) with component (B). Typically, the concentration of component (C) is sufficient to provide from 0.1 to 1000 ppm of a platinum group metal, preferably from 1 to 500 ppm of a platinum group metal, and more preferably from 5 to 150 ppm of a platinum group metal, based on the combined weight of components (A) and (B). The rate of cure is very slow below 0.1 ppm of platinum group metal. The use of more than 1000 ppm of platinum group metal results in no appreciable increase in cure rate, and is therefore uneconomical.

According to a second embodiment, the hydrosilylation-curable silicone composition comprises (A') a silicone resin having the formula $(R^1R^5{}_2SiO_{1/2})_w(R^5{}_2SiO_{2/2})_x(R^5SiO_{3/2})_y(SiO_{4/2})_z$ (III), wherein $R^1$ is $C_1$ to $C_{10}$ hydrocarbyl or $C_1$ to $C_{10}$ halogen-substituted hydrocarbyl, both free of aliphatic unsaturation, $R^5$ is $R^1$ or H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded hydrogen atoms per molecule; (B') an organosilicon compound having an average of at least two silicon-bonded alkenyl groups per molecule in an amount sufficient to cure the silicone resin; and (C) a catalytic amount of a hydrosilylation catalyst.

Component (A') is at least one silicone resin having the formula $(R^1R^5{}_2SiO_{1/2})_w(R^5{}_2SiO_{2/2})_x(R^5\ SiO_{3/2})_y(SiO_{4/2})_z$ (III), wherein $R^1$ is $C_1$ to $C_{10}$ hydrocarbyl or $C_1$ to $C_{10}$ halogen-substituted hydrocarbyl, both free of aliphatic unsaturation, $R^5$ is $R^1$ or —H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded hydrogen atoms per molecule. In the formula (III), $R^1$, w, x, y, z, y+z/(w+x+y+z), and w+x/(w+x+y+z) are as described and exemplified above for the silicone resin having the formula (I).

Typically at least 50 mol %, alternatively at least 65 mol %, alternatively at least 80 mol % of the groups $R^5$ in the silicone resin are hydrogen.

The silicone resin typically has a number-average molecular weight ($M_n$) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The viscosity of the silicone resin at 25° C. is typically from 0.01 to 100,000 Pa·s, alternatively from 0.1 to 10,000 Pa·s, alternatively from 1 to 100 Pa·s.

The silicone resin typically contains less than 10% (w/w), alternatively less than 5% (w/w), alternatively less than 2% (w/w), of silicon-bonded hydroxy groups, as determined by $^{29}Si$ NMR.

The silicone resin contains $R^5SiO_{3/2}$ units (i.e., T units) and/or $SiO_{4/2}$ units (i.e., Q units) in combination with $R^1R^5{}_2SiO_{1/2}$ units (i.e., M units) and/or $R^5{}_2SiO_{2/2}$ units (i.e., D units). For example, the silicone resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of silicone resins suitable for use as component (A') include, but are not limited to, resins having the following formulae: $(HMe_2SiO_{1/2})_{0.25}(PhSiO_{3/2})_{0.75}$, $(HMeSiO_{2/2})_{0.3}(PhSiO_{3/2})_{0.6}(MeSiO_{3/2})_{0.1}$, and $(Me_3SiO_{1/2})_{0.1}(H_2SiO_{2/2})_{0.1}(MeSiO_{3/2})_{0.4}(PhSiO_{3/2})_{0.4}$, where Me is methyl, Ph is phenyl, and the numerical subscripts outside the parenthesis denote mole fractions. Also, in the preceding formulae, the sequence of units is unspecified.

Component (A') can be a single silicone resin or a mixture comprising two or more different silicone resins, each as described above.

Methods of preparing silicone resins containing silicon-bonded hydrogen atoms are well known in the art; many of these resins are commercially available. Silicone resins are typically prepared by cohydrolyzing the appropriate mixture of chlorosilane precursors in an organic solvent, such as toluene. For example, a silicone resin consisting essentially of $R^1R^5{}_2SiO_{1/2}$ units and $R^5SiO_{3/2}$ units can be prepared by cohydrolyzing a compound having the formula $R^1R^5{}_2SiCl$ and a compound having the formula $R^5SiCl_3$ in toluene, where $R^1$ and $R^5$ are as described and exemplified above. The aqueous hydrochloric acid and silicone hydrolyzate are separated and the hydrolyzate is washed with water to remove residual acid and heated in the presence of a mild non-basic condensation catalyst to "body" the resin to the requisite viscosity. If desired, the resin can be further treated with a non-basic condensation catalyst in an organic solvent to reduce the content of silicon-bonded hydroxy groups. Alternatively, silanes containing hydrolysable groups other than chloro, such —Br, —I, —OCH₃, —OC(O)CH₃, —N(CH₃)₂, NHCOCH₃, and —SCH₃, can be utilized as starting materials in the cohydrolysis reaction. The properties of the resin products depend on the types of silanes, the mole ratio of silanes, the degree of condensation, and the processing conditions.

Component (B') is at least one organosilicon compound having an average of at least two silicon-bonded alkenyl groups per molecule in an amount sufficient to cure the silicone resin of component (A').

The organosilicon compound contains an average of at least two silicon-bonded alkenyl groups per molecule, alternatively at least three silicon-bonded alkenyl groups per molecule. It is generally understood that cross-linking occurs when the sum of the average number of silicon-bonded hydrogen atoms per molecule in component (A') and the average number of silicon-bonded alkenyl groups per molecule in component (B') is greater than four.

The organosilicon compound can be an organosilane or an organosiloxane. The organosilane can be a monosilane, disilane, trisilane, or polysilane. Similarly, the organosiloxane can be a disiloxane, trisiloxane, or polysiloxane. The structure of the organosilicon compound can be linear, branched, cyclic, or resinous. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded alkenyl groups can be located at terminal, pendant, or at both terminal and pendant positions.

Examples of organosilanes suitable for use as component (B') include, but are not limited to, silanes having the following formulae: $Vi_4Si$, $PhSiVi_3$, $MeSiVi_3$, $PhMeSiVi_2$, $Ph_2SiVi_2$, and $PhSi(CH_2CH=CH_2)_3$, where Me is methyl, Ph is phenyl, and Vi is vinyl.

Examples of organosiloxanes suitable for use as component (B') include, but are not limited to, siloxanes having the following formulae: $PhSi(OSiMe_2Vi)_3$, $Si(OSiMe_2Vi)_4$, $MeSi(OSiMe_2Vi)_3$, and $Ph_2Si(OSiMe_2Vi)_2$, where Me is methyl, Ph is phenyl, and Vi is vinyl.

Component (B') can be a single organosilicon compound or a mixture comprising two or more different organosilicon compounds, each as described above. For example component (B') can be a single organosilane, a mixture of two different organosilanes, a single organosiloxane, a mixture of two different organosiloxanes, or a mixture of an organosilane and an organosiloxane.

The concentration of component (B') is sufficient to cure (cross-link) the silicone resin of component (A'). The exact amount of component (B') depends on the desired extent of cure, which generally increases as the ratio of the number of moles of silicon-bonded alkenyl groups in component (B') to the number of moles of silicon-bonded hydrogen atoms in component (A') increases. The concentration of component (B') is typically sufficient to provide from 0.4 to 2 moles of silicon-bonded alkenyl groups, alternatively from 0.8 to 1.5 moles of silicon-bonded alkenyl groups, alternatively from 0.9 to 1.1 moles of silicon-bonded alkenyl groups, per mole of silicon-bonded hydrogen atoms in component (A').

Methods of preparing organosilanes and organosiloxanes containing silicon-bonded alkenyl groups are well known in the art; many of these compounds are commercially available.

Component (C) of the second embodiment of the silicone composition is as described and exemplified above for component (C) of the first embodiment.

According to a third embodiment, the hydrosilylation-curable silicone composition comprises (Au) a silicone resin having the formula $(R^1R^2_2SiO_{1/2})_w(R^2_2SiO_{2/2})_x(R^1SiO_{3/2})_y(SiO_{4/2})_z$ (I); (B) an organosilicon compound having an average of at least two silicon-bonded hydrogen atoms per molecule in an amount sufficient to cure the silicone resin; (C) a catalytic amount of a hydrosilylation catalyst; and (D) a silicone rubber having a formula selected from (i) $R^1R^2_2SiO(R^2_2SiO)_aSiR^2_2R^1$ (IV) and (ii) $R^5R^1_2SiO(R^1R^5SiO)_bSiR^1_2R^5$ (V); wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscripts a and b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin and the silicone rubber (D)(i) each have an average of at least two silicon-bonded alkenyl groups per molecule, the silicone rubber (D)(ii) has an average of at least two silicon-bonded hydrogen atoms per molecule, and the mole ratio of silicon-bonded alkenyl groups or silicon-bonded hydrogen atoms in the silicone rubber (D) to silicon-bonded alkenyl groups in the silicone resin (A) is from 0.01 to 0.5.

Components (A), (B), and (C) of the third embodiment of the silicone composition are as described and exemplified above for the first embodiment.

The concentration of component (B) is sufficient to cure (cross-link) the silicone resin of component (A). When component (D) is (D)(i), the concentration of component (B) is such that the ratio of the number of moles of silicon-bonded hydrogen atoms in component (B) to the sum of the number of moles of silicon-bonded alkenyl groups in component (A) and component (D)(i) is typically from 0.4 to 2, alternatively from 0.8 to 1.5, alternatively from 0.9 to 1.1. Furthermore, when component (D) is (D)(ii), the concentration of component (B) is such that the ratio of the sum of the number of moles of silicon-bonded hydrogen atoms in component (B) and component (D)(ii) to the number of moles of silicon-bonded alkenyl groups in component (A) is typically from 0.4 to 2, alternatively from 0.8 to 1.5, alternatively from 0.9 to 1.1.

Component (D) is a silicone rubber having a formula selected from (i) $R^1R^2_2SiO(R^2_2SiO)_aSiR^2_2R^1$ (IV) and (ii) $R^5R^1_2SiO(R^1R^5SiO)_bSiR^1_2R^5$ (V); wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, and subscripts a and b each have a value of from 1 to 4, provided the silicone rubber (D)(i) has an average of at least two silicon-bonded alkenyl groups per molecule, and the silicone rubber (D)(ii) has an average of at least two silicon-bonded hydrogen atoms per molecule.

Component (D)(i) is at least one silicone rubber having the formula $R^1R^2_2SiO(R^2_2SiO)_aSiR^2_2R^1$ (IV), wherein $R^1$ and $R^2$ are as described and exemplified above and the subscript a has a value of from 1 to 4, provided the silicone rubber (D)(i) has an average of at least two silicon-bonded alkenyl groups per molecule. Alternatively, the subscript a has a value of from 2 to 4 or from 2 to 3.

Examples of silicone rubbers suitable for use as component (D)(i) include, but are not limited to, silicone rubbers having the following formulae: $ViMe_2SiO(Me_2SiO)_aSiMe_2Vi$, $ViMe_2SiO(Ph_2SiO)_aSiMe_2Vi$, and $ViMe_2SiO(PhMeSiO)_aSiMe_2Vi$, where Me is methyl, Ph is phenyl, Vi is vinyl, and the subscript a has a value of from 1 to 4.

Component (D)(i) can be a single silicone rubber or a mixture comprising two or more different silicone rubbers, each having the formula (IV).

Component (D)(ii) is at least one silicone rubber having the formula $R^5R^1_2SiO(R^1R^5SiO)_bSiR^1_2R^5$ (V); wherein $R^1$ and $R^5$ are as described and exemplified above, and the subscript b has a value of from 1 to 4, provided the silicone rubber (D)(ii) has an average of at least two silicon-bonded hydrogen atoms per molecule. Alternatively, the subscript b has a value of from 2 to 4 or from 2 to 3.

Examples of silicone rubbers suitable for use as component (D)(ii) include, but are not limited to, silicone rubbers having the following formulae: $HMe_2SiO(Me_2SiO)_bSiMe_2H$, $HMe_2SiO(Ph_2SiO)_bSiMe_2H$, $HMe_2SiO(PhMeSiO)_bSiMe_2H$, and $HMe_2SiO(Ph_2SiO)_2(Me_2SiO)_2SiMe_2H$, where Me is methyl, Ph is phenyl, and the subscript b has a value of from 1 to 4.

Component (D)(ii) can be a single silicone rubber or a mixture comprising two or more different silicone rubbers, each having the formula (V).

The mole ratio of silicon-bonded alkenyl groups or silicon-bonded hydrogen atoms in the silicone rubber (D) to silicon-bonded alkenyl groups in the silicone resin (A) is typically from 0.01 to 0.5, alternatively from 0.05 to 0.4, alternatively from 0.1 to 0.3.

Methods of preparing silicone rubbers containing silicon-bonded alkenyl groups or silicon-bonded hydrogen atoms are well known in the art; many of these compounds are commercially available.

According to a fourth embodiment, the hydrosilylation-curable silicone composition comprises (A') a silicone resin having the formula $(R^1R^5{}_2SiO_{1/2})_w(R^5{}_2SiO_{2/2})_x(R^5SiO_{3/2})_y$ $(SiO_{4/2})_z$ (III); (B') an organosilicon compound having an average of at least two silicon-bonded alkenyl groups per molecule in an amount sufficient to cure the silicone resin; (C) a catalytic amount of a hydrosilylation catalyst; and (D) a silicone rubber having a formula selected from (i) $R^1R^2{}_2SiO$ $(R^2{}_2SiO)_aSiR^2{}_2R^1$ (IV) and (ii) $R^5R^1{}_2SiO(R^1R^5SiO)_b$ $SiR^1{}_2R^5$ (V); wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscripts a an b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin and the silicone rubber (D)(ii) each have an average of at least two silicon-bonded hydrogen atoms per molecule, the silicone rubber (D)(i) has an average of at least two silicon-bonded alkenyl groups per molecule, and the mole ratio of silicon-bonded alkenyl groups or silicon-bonded hydrogen atoms in the silicone rubber (D) to silicon-bonded hydrogen atoms in the silicone resin (A') is from 0.01 to 0.5.

Components (A'), (B'), and (C) of the fourth embodiment of the silicone composition are as described and exemplified above for the second embodiment, and component (D) of the fourth embodiment is as described and exemplified above for the third embodiment.

The concentration of component (B') is sufficient to cure (cross-link) the silicone resin of component (A'). When component (D) is (D)(i), the concentration of component (B') is such that the ratio of the sum of the number of moles of silicon-bonded alkenyl groups in component (B') and component (D)(i) to the number of moles of silicon-bonded hydrogen atoms in component (A') is typically from 0.4 to 2, alternatively from 0.8 to 1.5, alternatively from 0.9 to 1.1. Furthermore, when component (D) is (D)(ii), the concentration of component (B') is such that the ratio of the number of moles of silicon-bonded alkenyl groups in component (B') to the sum of the number of moles of silicon-bonded hydrogen atoms in component (A') and component (D)(ii) is typically from 0.4 to 2, alternatively from 0.8 to 1.5, alternatively from 0.9 to 1.1.

The mole ratio of silicon-bonded alkenyl groups or silicon-bonded hydrogen atoms in the silicone rubber (D) to silicon-bonded hydrogen atoms in the silicone resin (A') is typically from 0.01 to 0.5, alternatively from 0.05 to 0.4, alternatively from 0.1 to 0.3.

According to a fifth embodiment, the hydrosilylation-curable silicone composition comprises (A") a rubber-modified silicone resin prepared by reacting a silicone resin having the formula $(R^1R^2{}_2SiO_{1/2})_w(R^2{}_2SiO_{2/2})_x(R^1SiO_{3/2})_y(SiO_{4/2})_z$ (I) and a silicone rubber having the formula $R^5R^1{}_2SiO$ $(R^1R^5SiO)_cSiR^1{}_2R^5$ (VI) in the presence of a hydrosilylation catalyst and, optionally, an organic solvent to form a soluble reaction product, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, c has a value of from greater than 4 to 1,000, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (I) has an average of at least two silicon-bonded alkenyl groups per molecule, the silicone rubber (VI) has an average of at least two silicon-bonded hydrogen atoms per molecule, and the mole ratio of silicon-bonded hydrogen atoms in the silicone rubber (VI) to silicon-bonded alkenyl groups in silicone resin (I) is from 0.01 to 0.5; (B) an organosilicon compound having an average of at least two silicon-bonded hydrogen atoms per molecule in an amount sufficient to cure the rubber-modified silicone resin; and (C) a catalytic amount of a hydrosilylation catalyst.

Components (B) and (C) of the fifth embodiment of the silicone composition are as described and exemplified above for the first embodiment.

The concentration of component (B) is sufficient to cure (cross-link) the rubber-modified silicone resin. The concentration of component (B) is such that the ratio of the sum of the number of moles of silicon-bonded hydrogen atoms in component (B) and the silicone rubber (VI) to the number of moles of silicon-bonded alkenyl groups in the silicone resin (I) is typically from 0.4 to 2, alternatively from 0.8 to 1.5, alternatively from 0.9 to 1.1.

Component (A") is a rubber-modified silicone resin prepared by reacting at least one silicone resin having the formula $(R^1R^2{}_2SiO_{1/2})_w(R^2{}_2SiO_{2/2})_x(R^1SiO_{3/2})_y(SiO_{4/2})_z$ (I) and at least one silicone rubber having the formula $R^5R^1{}_2SiO$ $(R^1R^5SiO)_cSiR^1{}_2R^5$ (VI) in the presence of a hydrosilylation catalyst and, optionally, an organic solvent to form a soluble reaction product, wherein $R^1$, $R^2$, $R^5$, w, x, y, z, y+z/(w+x+y+z), and w+x/(w+x+y+z) are as described and exemplified above, and the subscript c has a value of from greater than 4 to 1,000.

The silicone resin having the formula (I) is as described and exemplified above for the first embodiment of the silicone composition. Also, the hydrosilylation catalyst and organic solvent are as described and exemplified above in the method of preparing the organohydrogenpolysiloxane resin having the formula (II). As used herein the term "soluble reaction product" means when organic solvent is present, the product of the reaction for preparing component (A") is miscible in the organic solvent and does not form a precipitate or suspension.

In the formula (VI) of the silicone rubber, $R^1$ and $R^5$ are as described and exemplified above, and the subscript c typically has a value of from greater than 4 to 1,000, alternatively from 10 to 500, alternatively from 10 to 50.

Examples of silicone rubbers having the formula (VI) include, but are not limited to, silicone rubbers having the following formulae: $HMe_2SiO(Me_2SiO)_{50}SiMe_2H$, $HMe_2SiO(Me_2SiO)_{10}SiMe_2H$, $HMe_2SiO(PhMeSiO)_{25}SiMe_2H$, and $Me_3SiO(MeHSiO)_{10}SiMe_3$, wherein Me is methyl, Ph is phenyl, and the numerical subscripts indicate the number of each type of siloxane unit.

The silicone rubber having the formula (VI) can be a single silicone rubber or a mixture comprising two or more different silicone rubbers, each having the formula (VI).

Methods of preparing silicone rubbers containing silicon-bonded hydrogen atoms are well known in the art; many of these compounds are commercially available.

The silicone resin (I), silicone rubber (VI), hydrosilylation catalyst, and organic solvent can be combined in any order. Typically, the silicone resin, silicone rubber, and organic solvent are combined before the introduction of the hydrosilylation catalyst.

The reaction is typically carried out at a temperature of from room temperature (~23±2° C.) to 150° C., alternatively from room temperature to 100° C.

The reaction time depends on several factors, including the structures of the silicone resin and the silicone rubber, and the temperature. The components are typically allowed to react for a period of time sufficient to complete the hydrosilylation reaction. This means the components are typically allowed to react until at least 95 mol %, alternatively at least 98 mol %, alternatively at least 99 mol %, of the silicon-bonded hydrogen atoms originally present in the silicone rubber have been consumed in the hydrosilylation reaction, as determined by FTIR spectrometry. The time of reaction is typically from 0.5 to 24 h at a temperature of from room temperature (~23±2° C.) to 100° C. The optimum reaction time can be determined by routine experimentation using the methods set forth in the Examples section below.

The mole ratio of silicon-bonded hydrogen atoms in the silicone rubber (VI) to silicon-bonded alkenyl groups in the silicone resin (I) is typically from 0.01 to 0.5, alternatively from 0.05 to 0.4, alternatively from 0.1 to 0.3.

The concentration of the hydrosilylation catalyst is sufficient to catalyze the addition reaction of the silicone resin (I) with the silicone rubber (VI). Typically, the concentration of the hydrosilylation catalyst is sufficient to provide from 0.1 to 1000 ppm of a platinum group metal, based on the combined weight of the resin and the rubber.

The concentration of the organic solvent is typically from 0 to 95% (w/w), alternatively from 10 to 75% (w/w), alternatively from 40 to 60% (w/w), based on the total weight of the reaction mixture.

The rubber-modified silicone resin can be used without isolation or purification in the fifth embodiment of the hydrosilylation-curable silicone composition or the resin can be separated from most of the solvent by conventional methods of evaporation. For example, the reaction mixture can be heated under reduced pressure. Moreover, when the hydrosilylation catalyst is a supported catalyst, described above, the rubber-modified silicone resin can be readily separated from the hydrosilylation catalyst by filtering the reaction mixture. However, when the rubber-modified silicone resin is not separated from the hydrosilylation catalyst used to prepare the resin, the catalyst may be used as component (C) of the fifth embodiment of the hydrosilylation-curable silicone composition.

According to a sixth embodiment, the hydrosilylation-curable silicone composition comprises (A''') a rubber-modified silicone resin prepared by reacting a silicone resin having the formula $(R^1R^5_2SiO_{1/2})_w(R^5_2SiO_{2/2})_x(R^5SiO_{3/2})_y(SiO_{4/2})_z$ (III) and a silicone rubber having the formula $R^1R^2_2SiO(R^2_2SiO)_dSiR^2_2R^1$ (VII) in the presence of a hydrosilylation catalyst and, optionally, an organic solvent to form a soluble reaction product, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscript d has a value of from greater than 4 to 1,000, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (III) has an average of at least two silicon-bonded hydrogen atoms per molecule, the silicone rubber (VII) has an average of at least two silicon-bonded alkenyl groups per molecule, and the mole ratio of silicon-bonded alkenyl groups in the silicone rubber (VII) to silicon-bonded hydrogen atoms in the silicone resin (III) is from 0.01 to 0.5; (B') an organosilicon compound having an average of at least two silicon-bonded alkenyl groups per molecule in an amount sufficient to cure the rubber-modified silicone resin; and (C) a catalytic amount of a hydrosilylation catalyst.

Components (B') and (C) of the sixth embodiment of the silicone composition are as described and exemplified above for the second embodiment.

The concentration of component (B') is sufficient to cure (cross-link) the rubber-modified silicone resin. The concentration of component (B') is such that the ratio of the sum of the number of moles of silicon-bonded alkenyl groups in component (B') and the silicone rubber (VII) to the number of moles of silicon-bonded hydrogen atoms in the silicone resin (III) is typically from 0.4 to 2, alternatively from 0.8 to 1.5, alternatively from 0.9 to 1.1.

Component (A''') is a rubber-modified silicone resin prepared by reacting at least one silicone resin having the formula $(R^1R^5_2SiO_{1/2})_w(R^5_2SiO_{2/2})_x(R^5SiO_{3/2})_y(SiO_{4/2})_z$ (III) and at least one silicone rubber having the formula $R^1R^2_2SiO(R^2_2SiO)_dSiR^2_2R^1$ (VII) in the presence of a hydrosilylation catalyst and an organic solvent to form a soluble reaction product, wherein $R^1$, $R^2$, $R^5$, w, x, y, z, y+z/(w+x+y+z), and w+x/(w+x+y+z) are as described and exemplified above, and the subscript d has a value of from greater than 4 to 1,000.

The silicone resin having the formula (III) is as described and exemplified above for the second embodiment of the hydrosilylation-curable silicone composition. Also, the hydrosilylation catalyst and organic solvent are as described and exemplified above in the method of preparing the organohydrogenpolysiloxane resin having the formula (II). As in the previous embodiment of the silicone composition, the term "soluble reaction product" means when organic solvent is present, the product of the reaction for preparing component (A''') is miscible in the organic solvent and does not form a precipitate or suspension.

In the formula (VII) of the silicone rubber, $R^1$ and $R^2$ are as described and exemplified above, and the subscript d typically has a value of from 4 to 1,000, alternatively from 10 to 500, alternatively form 10 to 50.

Examples of silicone rubbers having the formula (VII) include, but are not limited to silicone rubbers having the following formulae: $ViMe_2SiO(Me_2SiO)_{50}SiMe_2Vi$, $ViMe_2SiO(Me_2SiO)_{10}SiMe_2Vi$, $ViMe_2SiO(PhMeSiO)_{25}SiMe_2Vi$, and $Vi_2MeSiO(PhMeSiO)_{25}SiMe_2Vi$, wherein Me is methyl, Ph is phenyl, Vi is vinyl, and the numerical subscripts indicate the number or each type of siloxane unit.

The silicone rubber having the formula (VII) can be a single silicone rubber or a mixture comprising two or more different silicone rubbers, each having the formula (VII).

Methods of preparing silicone rubbers containing silicon-bonded alkenyl groups are well known in the art; many of these compounds are commercially available.

The reaction for preparing component (A''') can be carried out in the manner described above for preparing component (A'') of the fifth embodiment of the silicone composition, except the silicone resin having the formula (I) and the silicone rubber having the formula (VI) are replaced with the resin having the formula (III) and the rubber having the formula (VII), respectively. The mole ratio of silicon-bonded alkenyl groups in the silicone rubber (VII) to silicon-bonded hydrogen atoms in the silicone resin (III) is from 0.01 to 0.5, alternatively from 0.05 to 0.4, alternatively from 0.1 to 0.3. Moreover, the silicone resin and the silicone rubber are typically allowed to react for a period of time sufficient to complete the hydrosilylation reaction. This means the components are typically allowed to react until at least 95 mol %, alternatively at least 98 mol %, alternatively at least 99 mol %, of the silicon-bonded alkenyl groups originally present in the rubber have been consumed in the hydrosilylation reaction, as determined by FTIR spectrometry.

The hydrosilylation-curable silicone composition of the present method can comprise additional ingredients, provided the ingredient does not prevent the silicone composition from curing to form a cured silicone resin having low coefficient of thermal expansion, high tensile strength, and high modulus, as described below. Examples of additional ingredients include, but are not limited to, hydrosilylation catalyst inhibitors, such as 3-methyl-3-penten-1-yne, 3,5-dimethyl-3-hexen-1-yne, 3,5-dimethyl-1-hexyn-3-ol, 1-ethynyl-1-cyclohexanol, 2-phenyl-3-butyn-2-ol, vinylcyclosiloxanes, and triphenylphosphine; adhesion promoters, such as the adhesion promoters taught in U.S. Pat. Nos. 4,087,585 and 5,194,649; dyes; pigments; anti-oxidants; heat stabilizers; UV stabilizers; flame retardants; flow control additives; and diluents, such as organic solvents and reactive diluents.

For example, the hydrosilylation-curable silicone composition can contain (E) a reactive diluent comprising (i) an organosiloxane having an average of at least two silicon-bonded alkenyl groups per molecule and a viscosity of from 0.001 to 2 Pa·s at 25° C., wherein the viscosity of (E)(i) is not greater than 20% of the viscosity of the silicone resin, e.g., component (A), (A'), (A"), or (A'") above, of the silicone composition and the organosiloxane has the formula $(R^1R^2_2SiO_{1/2})_m(R^2_2SiO_{2/2})_n(R^1SiO_{3/2})_p(SiO_{4/2})_q$, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, m is 0 to 0.8, n=0 to 1, p=0 to 0.25, q=0 to 0.2, m+n+p+q=1, and m+n is not equal to 0, provided when p+q=0, n is not equal to 0 and the alkenyl groups are not all terminal, and (ii) an organohydrogensiloxane having an average of at least two silicon-bonded hydrogen atoms per molecule and a viscosity of from 0.001 to 2 Pa·s at 25° C., in an amount sufficient to provide from 0.5 to 3 moles of silicon-bonded hydrogen atoms in (E)(ii) per mole of alkenyl groups in (E)(i), wherein the organohydrogensiloxane has the formula $(HR^1_2SiO_{1/2})_s(R^1SiO_{3/2})_t(SiO_{4/2})_v$, wherein $R^1$ is $C_1$ to $C_{10}$ hydrocarbyl or $C_1$ to $C_{10}$ halogen-substituted hydrocarbyl, both free of aliphatic unsaturation, s is from 0.25 to 0.8, t is from 0 to 0.5, v is from 0 to 0.3, s+t+v=1, and t+v is not equal to 0.

Component (E)(i) is at least one organosiloxane having an average of at least two alkenyl groups per molecule and a viscosity of from 0.001 to 2 Pa·s at 25° C., wherein the viscosity of (E)(i) is not greater than 20% of the viscosity of the silicone resin of the silicone composition and the organosiloxane has the formula $(R^1R^2_2SiO_{1/2})_m (R^2_2SiO_{2/2})_n (R^1SiO_{3/2})_p(SiO_{4/2})_q$, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, m is 0 to 0.8, n=0 to 1, p=0 to 0.25, q=0 to 0.2, m+n+p+q=1, and m+n is not equal to 0, provided when p+q=0, n is not equal to 0 and the alkenyl groups are not all terminal (i.e., not all the alkenyl groups in the organosiloxane are in the $R^1R^2_2SiO_{1/2}$ units). Further, organosiloxane (E)(i) can have a linear, branched, or cyclic structure. For example, when the subscripts m, p, and q in the formula of organosiloxane (E)(i) are each equal to 0, the organosiloxane is an organocyclosiloxane.

The viscosity of organosiloxane (E)(i) at 25° C. is typically from 0.001 to 2 Pa·s, alternatively from 0.001 to 0.1 Pa·s, alternatively from 0.001 to 0.05 Pa·s. Further, the viscosity of organosiloxane (E)(i) at 25° C. is typically not greater than 20%, alternatively not greater than 10%, alternatively not greater than 1%, of the viscosity of the silicone resin in the hydrosilylation-curable silicone composition.

Examples of organosiloxanes suitable for use as organosiloxane (E)(i) include, but are not limited to, organosiloxanes having the following formulae: $(ViMeSiO)_3$, $(ViMeSiO)_4$, $(ViMeSiO)_5$, $(ViMeSiO)_6$, $(ViPhSiO)_3$, $(ViPhSiO)_4$, $(ViPhSiO)_5$, $(ViPhSiO)_6$, $ViMe_2SiO(ViMeSiO)_nSiMe_2Vi$, $Me_3SiO(ViMeSiO)_nSiMe_3$, and $(ViMe_2SiO)_4Si$, where Me is methyl, Ph is phenyl, Vi is vinyl, and the subscript n has a value such that the organosiloxane has a viscosity of from 0.001 to 2 Pa·s at 25° C.

Component (E)(i) can be a single organosiloxane or a mixture comprising two or more different organosiloxanes, each as described above. Methods of making alkenyl-functional organosiloxanes are well known in the art.

Component (E)(ii) is at least one organohydrogensiloxane having an average of at least two silicon-bonded hydrogen atoms per molecule and a viscosity of from 0.001 to 2 Pa·s at 25° C., in an amount sufficient to provide from 0.5 to 3 moles of silicon-bonded hydrogen atoms in (E)(ii) to moles of alkenyl groups in (E)(i), wherein the organohydrogensiloxane has the formula $(HR^1_2SiO_{1/2})_s(R^1SiO_{3/2})_t(SiO_{4/2})_v$, wherein $R^1$ is $C_1$ to $C_{10}$ hydrocarbyl or $C_1$ to $C_{10}$ halogen-substituted hydrocarbyl, both free of aliphatic unsaturation, s is from 0.25 to 0.8, t is from 0 to 0.5, v is from 0 to 0.3, s+t+v=1, and t+v is not equal to 0.

The viscosity of organohydrogensiloxane (E)(ii) at 25° C. is typically from 0.001 to 2 Pa·s, alternatively from 0.001 to 0.1 Pa·s, alternatively from 0.001 to 0.05 Pa·s Examples of organohydrogensiloxanes suitable for use as organohydrogensiloxane (E)(ii) include, but are not limited to, organohydrogensiloxanes having the following formulae: $PhSi(OSiMe_2H)_3$, $Si(OSiMe_2H)_4$, $MeSi(OSiMe_2H)_3$, $(HMe_2SiO)_3SiOSi(OSiMe_2H)_3$, and $(HMe_2SiO)_3SiOSi(Ph)(OSiMe_2H)_2$, where Me is methyl and Ph is phenyl.

Component (E)(ii) can be a single organohydrogensiloxane or a mixture comprising two or more different organohydrogensiloxanes, each as described above. Methods of making organohydrogensiloxanes are well known in the art.

The concentration of component (E)(ii) is sufficient to provide from 0.5 to 3 moles of silicon-bonded hydrogen atoms, alternatively from 0.6 to 2 moles of silicon-bonded hydrogen atoms, alternatively from 0.9 to 1.5 moles of silicon-bonded hydrogen atoms, per mole of alkenyl groups in component (E)(i).

The concentration of the reactive diluent (E), components (E)(i) and (E)(ii) combined, in the hydrosilylation-curable silicone composition is typically from 0 to 90% (w/w), alternatively from 0 to 50% (w/w), alternatively from 0 to 20% (w/w), alternatively from 0 to 10% (w/w), based on the combined weight of the silicone resin, component (A), (A'), (A"), or (A'"), and the organosilicon compound, component (B) or (B') in the embodiments above.

The carbon nanomaterial of the nanomaterial-filled silicone composition can be any carbon material having at least one physical dimension (e.g., particle diameter, fiber diameter, layer thickness) less than about 200 nm. Examples of carbon nanomaterials include, but are not limited to, carbon nanoparticles having three dimensions less than about 200 nm, such as quantum dots, hollow spheres, and fullerenes; fibrous carbon nanomaterials having two dimensions less than about 200 nm, such as nanotubes (e.g., single-walled nanotubes and multi-walled nanotubes) and nanofibers (e.g., axially aligned, platelet, and herringbone or fishbone nanofibers); and layered carbon nanomaterials having one dimension less than about 200 nm, such as carbon nanoplatelets (e.g., exfoliated graphite and graphene sheet). The carbon nanomaterial can be electrically conductive or semiconductive.

The carbon nanomaterial can also be an oxidized carbon nanomaterial, prepared by treating the aforementioned carbon nanomaterials with an oxidizing acid or mixture of acids at elevated temperature. For example, the carbon nanomaterial can be oxidized by heating the material in a mixture of concentrated nitric and concentrated sulfuric acid (1:3 v/v, 25 mL/g carbon) at a temperature of from 40 to 150° C. for 1-3 hours.

The carbon nanomaterial can be a single carbon nanomaterial or a mixture comprising at least two different carbon nanomaterials, each as described above.

The concentration of the carbon nanomaterial is typically from 0.0001 to 99% (w/w), alternatively from 0.001 to 50% (w/w), alternatively from 0.01 to 25% (w/w), alternatively from 0.1 to 10% (w/w), alternatively from 1 to 5% (w/w), based on the total weight of the nanomaterial-filled silicone composition.

Methods of preparing carbon nanomaterials are well-known in the art. For example, carbon nanoparticles (e.g., fullerenes) and fibrous carbon nanomaterials (e.g., nanotubes, and nanofibers) can be prepared using at least one of the following methods: arc discharge, laser ablation, and catalytic chemical vapor deposition. In the arc discharge process, an arc discharge between two graphite rods produces, depending on the gas atmosphere, single-walled nanotubes, multi-walled nanotubes, and fullerenes. In the laser ablation method, a graphite target loaded with a metal catalyst is irradiated with a laser in a tube furnace to produce single- and multi-walled nanotubes. In the catalytic chemical vapor deposition method, a carbon-containing gas or gas mixture is introduced into a tube furnace containing a metal catalyst at a temperature of from 500 to 1000° C. (and different pressures) to produce carbon nanotubes and nanofibers. Carbon nanoplatelets can be prepared by the intercalation and exfoliation of graphite.

The nanomaterial-filled silicone composition can be a one-part composition containing the silicone resin, organosilicon compound, hydrosilylation catalyst, and carbon nanomaterial in a single part or, alternatively, a multi-part composition comprising these components in two or more parts.

The one-part nanomaterial-filled silicone composition is typically prepared by combining the components of the hydrosilylaltion-curable silicone composition, the carbon nanomaterial, and any optional ingredients in the stated proportions at ambient temperature, with or without the aid of an organic solvent. Although the order of addition of the various components is not critical if the silicone composition is to be used immediately, the hydrosilylation catalyst is preferably added last at a temperature below about 30° C. to prevent premature curing of the composition. Also, the multi-part nanomaterial-filled silicone composition can be prepared by combining the components in each part.

Mixing can be accomplished by any of the techniques known in the art such as milling, blending, and stirring, either in a batch or continuous process. The particular device is determined by the viscosity of the components and the viscosity of the final silicone composition.

A method of preparing a silicone resin film according to the present invention comprises the steps of:
    coating a release liner with a nanomaterial-filled silicone composition, wherein the silicone composition comprises:
        a hydrosilylation-curable silicone composition comprising a silicone resin having an average of at least two silicon-bonded alkenyl groups or silicon-bonded hydrogen atoms per molecule, and
        a carbon nanomaterial; and
    heating the coated release liner at a temperature sufficient to cure the silicone resin.

In the first step of the method of preparing a silicone resin film, a release liner is coated with a nanomaterial-filled silicone composition, wherein the nanomaterial-filled silicone composition is as described and exemplified above.

The release liner can be any rigid or flexible material having a surface from which the silicone resin film can be removed without damage by delamination after the silicone resin is cured, as described below. Examples of release liners include, but are not limited to, silicon, quartz; fused quartz; aluminum oxide; ceramics; glass; metal foils; polyolefins such as polyethylene, polypropylene, polystyrene, and polyethyleneterephthalate; fluorocarbon polymers such as polytetrafluoroethylene and polyvinylfluoride; polyamides such as Nylon; polyimides; polyesters such as poly(methyl methacrylate); epoxy resins; polyethers; polycarbonates; polysulfones; and polyether sulfones. The release liner can also be a material, as exemplified above, having a surface treated with a release agent, such as a silicone release agent.

The release liner can be coated with the nanomaterial-filled silicone composition using conventional coating techniques, such as spin coating, dipping, spraying, brushing, or screen-printing. The amount of silicone composition is sufficient to form a cured silicone resin film having a thickness of from 1 to 500 μm in the second step of the method, described below.

In the second step of the method of preparing a silicone resin film, the coated release liner is heated at a temperature sufficient to cure the silicone resin. The coated release liner can be heated at atmospheric, subatmospheric, or supraatmospheric pressure. The coated release liner is typically heated at a temperature of from room temperature (~23±2° C.) to 250° C., alternatively from room temperature to 200° C., alternatively from room temperature to 150° C., at atmospheric pressure. The coated release liner is heated for a length of time sufficient to cure (cross-link) the silicone resin. For example, the coated release liner is typically heated at a temperature of from 150 to 200° C. for a time of from 0.1 to 3 h.

Alternatively, the coated release liner can be heated in a vacuum at a temperature of from 100 to 200° C. and a pressure of from 1,000 to 20,000 Pa for a time of from 0.5 to 3 h. The coated release liner can be heated in a vacuum using a conventional vacuum bagging process. In a typical process, a bleeder (e.g., polyester) is applied over the coated release liner, a breather (e.g, Nylon, polyester) is applied over the bleeder, a vacuum bagging film (e.g., Nylon) equipped with a vacuum nozzle is applied over the breather, the assembly is sealed with tape, a vacuum (e.g., 1,000 Pa) is applied to the sealed assembly, and the evacuated bag is heated as described above.

The method of preparing the silicone resin film can further comprise, before the second step of heating, applying a second release liner to the coated release liner of the first step to form an assembly, and compressing the assembly. The assembly can be compressed to remove excess silicone composition and/or entrapped air, and to reduce the thickness of the coating. The assembly can be compressed using conventional equipment such as a stainless steel roller, hydraulic press, rubber roller, or laminating roll set. The assembly is typically compressed at a pressure of from 1,000 Pa to 10 MPa and at a temperature of from room temperature (~23±2° C.) to 50° C.

The method can further comprise the step of separating the cured silicone resin from the release liner(s). The cured silicone resin can be separated from the release liner by mechanically peeling the film away from the release liner.

The method of the present invention can further comprise forming a coating on at least a portion of the silicone resin film. Examples of coatings include, but are not limited to, cured silicone resins prepared by curing hydrosilylation-curable silicone resins or condensation-curable silicone resins; cured silicone resins prepared by curing sols of organosilsesquioxane resins; inorganic oxides, such as indium tin oxide, silicon dioxide, and titanium dioxide; inorganic nitrides, such as silicon nitride and gallium nitride; metals, such as copper, silver, gold, nickel, and chromium; and silicon, such as amorphous silicon, microcrystalline silicon, and polycrystalline silicon.

The silicone resin film of the present invention typically comprises from 10 to 99% (w/w), alternatively from 30 to 95% (w/w), alternatively from 60 to 95% (w/w), alternatively from 80 to 95% (w/w), of the cured silicone resin. Also, the silicone resin film typically has a thickness of from 1 to 500 µm, alternatively from 15 to 500 µm, alternatively from 15 to 300 µm, alternatively from 20 to 150 µm, alternatively from 30 to 125 µm.

The silicone resin film typically has a flexibility such that the film can be bent over a cylindrical steel mandrel having a diameter less than or equal to 3.2 mm without cracking, where the flexibility is determined as described in ASTM Standard D522-93a, Method B.

The silicone resin film has low coefficient of linear thermal expansion (CTE), high tensile strength, and high modulus. For example the film typically has a CTE of from 0 to 80 µm/m° C., alternatively from 0 to 20 µm/m° C., alternatively from 2 to 10 µm/m° C., at temperature of from room temperature (~23±2° C.) to 200° C. Also, the film typically has a tensile strength at 25° C. of from 5 to 200 MPa, alternatively from 20 to 200 MPa, alternatively from 50 to 200 MPa. Further, the silicone resin film typically has a Young's modulus at 25° C. of from 0.5 to 10 GPa, alternatively from 1 to 6 GPa, alternatively from 3 to 5 GPa.

The transparency of the silicone resin film depends on a number of factors, such as the composition of the cured silicone resin, the thickness of the film, and the type and concentration of the carbon nanomaterial. The silicone resin film typically has a transparency (% transmittance) of at least 50%, alternatively at least 60%, alternatively at least 75%, alternatively at least 85%, in the visible region of the electromagnetic spectrum.

The silicone resin film of the present invention has low coefficient of thermal expansion, high tensile strength, and high modulus compared to a silicone resin film prepared from the same silicone composition absent the carbon nanomaterial. Also, although the filled (i.e., carbon nanomaterial-containing) and unfilled silicone resin films have comparable glass transition temperatures, the former film typically exhibits a smaller change in modulus in the temperature range corresponding to the glass transition.

The silicone resin film of the present invention is useful in applications requiring films having high thermal stability, flexibility, mechanical strength, and transparency. For example, the silicone resin film can be used as an integral component of flexible displays, solar cells, flexible electronic boards, touch screens, fire-resistant wallpaper, and impact-resistant windows. The film is also a suitable substrate for transparent or nontransparent electrodes.

EXAMPLES

The following examples are presented to better illustrate the nanomaterial-filled silicone composition, method, and silicone resin film of the present invention, but are not to be considered as limiting the invention, which is delineated in the appended claims. Unless otherwise noted, all parts and percentages reported in the examples are by weight. The following methods and materials were employed in the examples:

Measurement of Mechanical Properties

Young's modulus, tensile strength, and tensile strain at break were measured using an MTS Alliance RT/5 testing frame, equipped with a 100-N load cell. Young's modulus, tensile strength, and tensile strain were determined at room temperature (~23±2° C.) for the test specimens of Examples 4 and 5.

The test specimen was loaded into two pneumatic grips spaced apart 25 mm and pulled at a crosshead speed of 1 mm/min. Load and displacement data were continuously collected. The steepest slope in the initial section of the load-displacement curve was taken as the Young's modulus. Reported values for Young's modulus (GPa), tensile strength (MPa), and tensile strain (%) each represent the average of three measurements made on different dumbbell-shaped test specimens from the same silicone resin film.

The highest point on the load-displacement curve was used to calculate the tensile strength according to the equation:

$$\sigma = F/(wb),$$

where:
σ=tensile strength, MPa,
F=highest force, N,
w=width of the test specimen, mm, and
b=thickness of the test specimen, mm.

The tensile strain at break was approximated by dividing the difference in grip separation before and after testing by the initial separation according to the equation:

$$\in = 100(l_2 - l_1)/l_1,$$

where:
∈=tensile strain at break, %,
$l_2$=final separation of the grips, mm, and
$l_1$=initial separation of the grips, mm.

Pyrograf®-III grade HHT-19 carbon nanofiber, sold by Pyrograf Products, Inc. (Cedarville, Ohio), is a heat-treated (up to 3000° C.) carbon nanofiber having a diameter of 100 to 200 nm and a length of 30,000 to 100,000 nm.

Silicone Base A: a mixture containing 82% of a silicone resin having the formula $(PhSiO_{3/2})_{0.75}(ViMe_2SiO_{1/2})_{0.25}$, where the resin has a weight-average molecular weight of about 1700, a number-average molecular weight of about 1440, and contains about 1 mol % of silicon-bonded hydroxy groups; and 18% of 1,-4-bis(dimethylsilyl)benzene. The mole ratio of silicon-bonded hydrogen atoms in the 1,-4-bis (dimethylsilyl)benzene to silicon-bonded vinyl groups in the silicone resin is 1.1:1, as determined by $^{29}$SiNMR and $^{13}$CNMR.

Silicone Base B: a mixture containing 76% of a silicone resin having the formula $(PhSiO_{3/2})_{0.75}(ViMe_2SiO_{1/2})_{0.25}$, where the resin has a weight-average molecular weight of about 1700, a number-average molecular weight of about 1440, and contains about 1 mol % of silicon-bonded hydroxy groups; 9.5% of phenyltris(dimethylsiloxy)silane; and 14.5% of 1,1,5,5-tetramethyl-3,3-diphenyltrisiloxane. The mole ratios of silicon-bonded hydrogen atoms in the phenyltris (dimethylsiloxy)silane to silicon-bonded vinyl groups in the Silicone Resin, and silicon-bonded hydrogen atoms in the 1,1,5,5-tetramethyl-3,3-diphenyltrisiloxane to silicon-bonded vinyl groups are each 0.55:1, as determined by $^{29}$SiNMR and $^{13}$CNMR.

Melinex® 516, sold by Dupont Teijin Films (Hopewell, Va.), is a polyethylene-terephthalate (PET) film, which is pretreated for slip, having a thickness of 125 µm.

Example 1

This example demonstrates the preparation of a chemically oxidized carbon nanofiber. Pyrograf®-III carbon nanofiber (2.0 g), 12.5 mL of concentrated nitric acid, and 37.5 mL of concentrated sulfuric acid were combined sequentially in a 500-mL three-neck flask equipped with a condenser, thermometer, Teflon-coated magnetic stirring bar, and a temperature controller. The mixture was heated to 80° C. and kept at this temperature for 3 h. The mixture was then cooled by placing the flask on a layer of dry ice in a one gallon pail. The mixture was poured into a Buchner funnel containing a nylon membrane (0.8 µm) and the carbon nanofibers were collected by vacuum filtration. The nanofibers remaining on the membrane were washed several times with deionized water until the pH of the filtrate was equal to the pH of the wash water. After the last wash, the carbon nanofibers were kept in the funnel for an additional 15 min. with continued application of the vacuum. Then the nanofibers, supported on the filter membrane, were placed in an oven at 100° C. for 1 h. The carbon nanofibers were removed from filter membrane and stored in a dry sealed glass jar.

Example 2

The oxidized carbon nanofiber of Example 1 (0.1 g) was mixed with Silicone Base A (9.9 g) in a glass vial, followed by the addition of 4.0 g of heptane. The vial was placed in an ultrasonic bath for 115 min. The mixture was then subjected to centrifugation at 1500 rpm for 30 min. The supernatant was transferred to a clean vial and kept under vacuum (45 mm Hg) at 50° C. for 90 min. to remove most of the heptane.

Example 3

The oxidized carbon nanofiber of Example 1 (0.04 g) was mixed with Silicone Base B (20.0 g) in a glass vial, followed by the addition of 8.0 g of heptane. The vial was placed in an ultrasonic bath for 115 min. The mixture was then subjected to centrifugation at 1500 rpm for 30 min. The supernatant was transferred to a clean vial and kept under vacuum (45 mm Hg) at 50° C. for 90 min. to remove most of the heptane.

Example 4

The silicone composition of Example 2 (4.0 g) was mixed with 0.05 g of a catalyst consisting of a platinum(0) complex of 1,3-divinyl-1,1,3,3,-tetramethyldisiloxane in toluene, and containing 1000 ppm of platinum. The resulting composition (2.0 g) was applied on the surface of a Melinex® 516 PET film (8 in.×11 in.). An identical PET film was placed on top of the coating with the release agent-treated side in contact with the silicone composition. The stack was then passed between two stainless steel bars separated by a distance of 300 µm. The laminate was heated in an oven according to the following cycle: room temperature to 80° C. at 2° C./minute, 80° C. for 30 min., 80° C. to 120° C. at 2° C./minute, 120° C. for 60 min. The oven was turned off and the laminate was allowed to cool to room temperature inside the oven. The upper PET film was separated (peeled away) from the silicone resin film, and the silicone resin film was then separated from the lower PET film. The mechanical properties of the silicone resin film are shown in Table 1.

Example 5

A silicone resin film was prepared according to the method of Example 4, except the silicone composition of Example 3 was substituted for the silicone composition of Example 2. The mechanical properties of the silicone resin film are shown in Table 1.

TABLE 1

| Ex. | Thickness (mm) | Tensile Strength (MPa) | Young's Modulus (MPa) | Tensile Strain at Break (%) |
|---|---|---|---|---|
| 4 | 0.117 | 8.4 | 328.9 | 49.7 |
| 5 | 0.100 | 12.4 | 591.3 | 11.6 |

That which is claimed is:

1. A nanomaterial-filled silicone composition, comprising: a hydrosilylation-curable silicone composition comprising (A) a silicone resin having the formula $(R^1R^2_2SiO_{1/2})_w(R^2_2SiO_{2/2})_x(R^1SiO_{3/2})_y(SiO_{4/2})_z$ (I), or (A') a silicone resin having the formula $(R^1R^5_2SiO_{1/2})_w(R^5_2SiO_{2/2})_x(R^5SiO_{3/2})_y(SiO_{4/2})_z$ (III), wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (A) has an average of at least two silicon-bonded alkenyl groups per molecule or that the silicone resin (A') has an average of at least two silicon-bonded hydrogen atoms per molecule; and a carbon nanomaterial.

2. The nanomaterial-filled silicone composition according to claim 1, wherein the hydrosilylation-curable silicone composition comprises the silicone resin (A) having the formula $(R^1R^2_2SiO_{1/2})_w(R^2_2SiO_{2/2})_x(R^1SiO_{3/2})_y(SiO_{4/2})_z$ (I); (B) an organosilicon compound having an average of at least two silicon-bonded hydrogen atoms per molecule in an amount sufficient to cure the silicone resin (A) and (C) a catalytic amount of a hydrosilylation catalyst.

3. The nanomaterial-filled silicone composition according to claim 1, wherein the hydrosilylation-curable silicone composition comprises the silicone resin having the formula $(R^1R^5_2SiO_{1/2})_w(R^5_2SiO_{2/2})_x(R^5SiO_{3/2})_y(SiO_{4/2})_z$ (III); (B') an organosilicon compound having an average of at least two silicon-bonded alkenyl groups per molecule in an amount sufficient to cure the silicone resin (A'); and (C) a catalytic amount of a hydrosilylation catalyst.

4. The nanomaterial-filled silicone composition according to claim 1, wherein the hydrosilylation-curable silicone composition comprises the silicone resin (A) having the formula $(R^1R^2_2SiO_{1/2})_w(R^2_2SiO_{2/2})_x(R^1SiO_{3/2})_y(SiO_{4/2})_z$ (I); the organosilicon compound (B) having an average of at least two silicon-bonded hydrogen atoms per molecule in an amount sufficient to cure the silicone resin (A); and (C) a catalytic amount of a hydrosilylation catalyst; and (D) a silicone rubber having a formula selected from (i) $R^1R^2_2SiO(R^2_2SiO)_aSiR^2_2R^1$ (IV) and (ii) $R^5R^1_2SiO(R^1R^5SiO)_bSiR^1_2R^5$ (V); wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscripts a and b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (A) and the silicone rubber (D)(i) each have an average of at least two silicon-bonded alkenyl groups per molecule, the silicone rubber (D)(ii) has an average of at least two silicon-bonded hydrogen atoms per molecule, and the mole ratio of silicon-bonded alkenyl groups or silicon-bonded hydrogen atoms in the silicone rubber (D) to silicon-bonded alkenyl groups in the silicone resin (A) is from 0.01 to 0.5.

5. The nanomaterial-filled silicone composition according to claim 1, wherein the hydrosilylation-curable silicone composition comprises the silicone resin (A') having the formula $(R^1R^5{}_2SiO_{1/2})_w(R^5{}_2SiO_{2/2})_x(R^5SiO_{3/2})_y(SiO_{4/2})_z$ (III); the organosilicon compound (B') having an average of at least two silicon-bonded alkenyl groups per molecule in an amount sufficient to cure the silicone resin; (A'); (C) a catalytic amount of a hydrosilylation catalyst; and (D) a silicone rubber having a formula selected from (i) $R^1R^2{}_2SiO(R^2{}_2SiO)_aSiR^2{}_2R^1$ (IV) and (ii) $R^5R^1{}_2SiO(R^1R^5SiO)_bSiR^1{}_2R^5$ (V); wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscripts a and b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (A')and the silicone rubber (D)(ii) each have an average of at least two silicon-bonded hydrogen atoms per molecule, the silicone rubber (D)(i) has an average of at least two silicon-bonded alkenyl groups per molecule, and the mole ratio of silicon-bonded alkenyl groups or silicon-bonded hydrogen atoms in the silicone rubber (D) to silicon-bonded hydrogen atoms in the silicone resin (A') is from 0.01 to 0.5.

6. The nanomaterial-filled silicone composition according to any of the preceding claims, wherein the hydrosilylation-curable silicone composition further comprises (E) a reactive diluent comprising (i) an organosiloxane having an average of at least two silicon-bonded alkenyl groups per molecule and a viscosity of from 0.001 to 2 Pa·s at 25° C., wherein the viscosity of (E)(i) is not greater than 20% of the viscosity of the silicone resin of the silicone composition and the organosiloxane has the formula $(R^1R^2{}_2SiO_{1/2})_m(R^2{}_2SiO_{2/2})_n(R^1SiO_{3/2})_p(SiO_{4/2})_q$, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, m is 0 to 0.8, n=0 to 1, p=0 to 0.25, q=0 to 0.2, m+n+p+q=1, and m+n is not equal to 0, provided when p+q=0, n is not equal to 0 and the alkenyl groups are not all terminal, and (ii) an organohydrogensiloxane having an average of at least two silicon-bonded hydrogen atoms per molecule and a viscosity of from 0.001 to 2 Pa·s at 25° C., in an amount sufficient to provide from 0.5 to 3 moles of silicon-bonded hydrogen atoms in (E)(ii) per mole of alkenyl groups in (E)(i), wherein the organohydrogensiloxane has the formula $(HR^1{}_2SiO_{1/2})_s(R^1SiO_{3/2})_t(SiO_{4/2})_v$, wherein $R^1$ is $C_1$ to $C_{10}$ hydrocarbyl or $C_1$ to $C_{10}$ halogen-substituted hydrocarbyl, both free of aliphatic unsaturation, s is from 0.25 to 0.8, t is from 0 to 0.5, v is from 0 to 0.3, s+t+v=1, and t+v is not equal to 0.

7. The nanomaterial-filled silicone composition according to claim 2 or 4, wherein the organosilicon compound of component (B) is an organohydrogenpolysiloxane resin having the formula $(R^1R^4{}_2SiO_{1/2})_w(R^4{}_2SiO_{2/2})_x(R^1SiO_{3/2})_y(SiO_{4/2})_z$ (II), wherein $R^1$ is $C_1$ to $C_{10}$ hydrocarbyl or $C_1$ to $C_{10}$ halogen-substituted hydrocarbyl, both free of aliphatic unsaturation, $R^4$ is $R^1$ or an organosilylalkyl group having at least one silicon-bonded hydrogen atom, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided at least 50 mol % of the groups $R^4$ are organosilylalkyl.

8. The nanomaterial-filled silicone composition according to claim 1, wherein the carbon nanomaterial is selected from carbon nanoparticles, fibrous carbon nanomaterials, and layered carbon nanomaterials.

9. The nanomaterial-filled silicone composition according to claim 1, wherein the concentration of the carbon nanomaterial is from 0.001 to 50% (w/w), based on the total weight of the nanomaterial-filled silicone composition.

10. A method of preparing a silicone resin film, the method comprising the steps of: coating a release liner with a nanomaterial-filled silicone composition, wherein the silicone composition comprises: a hydrosilylation-curable silicone composition comprising (A) a silicone resin having the formula $(R^1R^2{}_2SiO_{1/2})_w(R^2{}_2SiO_{2/2})_x(R^1SiO_{3/2})_y(SiO_{4/2})_z$(I) or (A') a silicone resin having the formula $(R^1R^5{}_2SiO_{1/2})_w(R^5{}_2SiO_{2/2})_x(R^5SiO_{3/2})_y(SiO_{4/2})_z$(III), wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 1.01 to 0.8, provided the silicone resin (A) has an average of at least two silicon-bonded alkenyl groups per molecule or that the silicone resin (A') has an average of at least two silicon-bonded hydrogen atoms per molecule, and a carbon nanomaterial; and heating the coated release liner at a temperature sufficient to cure the silicone resin.

11. The method according to claim 10, wherein the carbon nanomaterial is selected from carbon nanoparticles, fibrous carbon nanomaterials, and layered carbon nanomaterials.

12. The method according to claim 10, wherein the concentration of the carbon nanomaterial is from 0.001 to 50% (w/w), based on the total weight of the nanomaterial-filled silicone composition.

13. The method according to claim 10, further comprising forming a coating on at least a portion of the silicone resin film.

14. The method according to claim 13, wherein the coating is a cured silicone resin.

15. A silicone resin film prepared according to the methods of claims 10 or 13.

16. The nanomaterial-filled silicone composition according to claim 1, wherein the silicone resin (A) is reacted with a silicone rubber having the formula $R^5R^1{}_2SiO(R^1R^5SiO)_cSiR^1{}_2R^5$ (VI) in the presence of a hydrosilylation catalyst and, optionally, an organic solvent for form (A") a rubber-modified silicone resin, wherein $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscript c has a value of from greater than 4 to 1,000, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone rubber (VI) has an average of at least two silicon-bonded hydrogen atoms per molecule, and the mole ratio of silicone-bonded hydrogen atoms in the silicone rubber (VI) to silicon-bonded alkenyl groups in silicone resin (A) is from 0.01 to 0.5; and wherein the hydrosilylation-curable silicone composition further comprises (B) an organosilicon compound having an average of at least two silicon-bonded hydrogen atoms per molecule in an amount sufficient to cure the rubber-modified silicone resin (A"); and (C) a catalytic amount of a hydrosilylation catalyst.

17. The nanomaterial-filled silicone composition according to claim 1, wherein the silicone resin (A') is reacted with a silicone rubber having the formula $R^1R^2{}_2SiO(R^2{}_2SiO)_dSiR^2{}_2R^1$ (VII) in the presence of a hydrosilylation catalyst and, optionally, an organic solvent to form (A''') a rubber-modified silicone resin, where $R^1$ is $C_1$ to $C_{10}$ hydrocarbyl or $C_1$ to $C_{10}$ halogen-substituted hydrocarbyl, both free of aliphatic unsaturation, $R^2$ is $R^1$ or alkenyl, $R^5$ is $R^1$ or —H, subscript d has a value of from greater than 4 to 1,000, w is from 0 to 0.8, x is from 0 to 0.6, y is from 0 to 0.99, z is from 0 to 0.35, w +x+y+z=1, y+z/(w+x+y+z) is from 0.2 to 0.99, and w+x/(w+x+y+z) is from 0.01 to 0.8, provided the silicone rubber (VII) has an average of at least two silicon-bonded alkenyl groups per molecule, and the mole ration of silicon-bonded alkenyl groups in the silicone rubber (VII) to silicon-bonded hydrogen atoms in the silicone resin (A') is from 0.01 to 0.5; and wherein the hydrosilylation-curable silicone composition further comprises (B') an organolilicon compound having an average of at least two silicon-bonded alkenyl groups per molecule in an amount sufficient to cure the rubber-modified silicone resin (A'''); and (C) a catalytic amount of a hydrosilylation catalyst.

\* \* \* \* \*